(12) United States Patent
Liu

(10) Patent No.: US 8,070,067 B2
(45) Date of Patent: Dec. 6, 2011

(54) RECEPTACLES FOR REMOVABLE ELECTRICAL INTERFACE DEVICES

(75) Inventor: Chih-Yuan Liu, Hsinchu County (TW)

(73) Assignee: Industrial Technology Research Institute, Hsinchu (TW)

(*) Notice: Subject to any disclaimer, the term of this patent is extended or adjusted under 35 U.S.C. 154(b) by 1013 days.

(21) Appl. No.: 11/849,224

(22) Filed: Aug. 31, 2007

(65) Prior Publication Data

US 2008/0076301 A1    Mar. 27, 2008

Related U.S. Application Data

(63) Continuation-in-part of application No. 11/426,706, filed on Jun. 27, 2006.

(60) Provisional application No. 60/753,328, filed on Dec. 22, 2005.

(51) Int. Cl.
 *G06K 7/00*    (2006.01)
(52) U.S. Cl. ....................................... 235/486
(58) Field of Classification Search .................. 235/492, 235/439, 441, 486
 See application file for complete search history.

(56) References Cited

U.S. PATENT DOCUMENTS

| | | | | |
|---|---|---|---|---|
| 6,137,710 | A * | 10/2000 | Iwasaki et al. | 365/52 |
| 6,612,498 | B1 * | 9/2003 | Lipponen et al. | 235/486 |
| 6,786,415 | B2 * | 9/2004 | Yiu | 235/486 |
| 6,890,188 | B1 | 5/2005 | Le | |
| 7,095,618 | B1 * | 8/2006 | Mambakkam et al. | 361/737 |
| 7,108,560 | B1 | 9/2006 | Chou et al. | |
| 2002/0065001 | A1 | 5/2002 | Sun | |
| 2003/0229746 | A1 | 12/2003 | Liu et al. | |
| 2004/0026516 | A1 * | 2/2004 | Liu et al. | 235/492 |

(Continued)

FOREIGN PATENT DOCUMENTS

EP    1 801 740 A    6/2007

(Continued)

OTHER PUBLICATIONS

LetsGoDigital [online] [retrieved Jan. 26, 2011]. Retrieved from the Internet: <URL: http://www.letsgoditial.org/printerfriendly.php?id=3396&lang=en>. 1 page.

(Continued)

*Primary Examiner* — Seung Lee
(74) *Attorney, Agent, or Firm* — Alston & Bird LLP

(57) ABSTRACT

A receptacle device for an electrical interface device, the electrical interface device being capable of transferring data to and from a host and being adapted to operate in one of a universal serial bus (USB)-compatible mode, a Mu mode and a non-USB-compatible mode, the receptacle comprising a chamber defined by a first inner surface and a second inner surface, the first inner surface being opposed to the second inner surface, a first row of contacts arranged at the first inner surface, the first row of contacts being configured to electrically couple to a first row of pads of the electrical interface device when the electrical interface device is inserted into the chamber in a direction, a second row of contacts arranged at the first inner surface, the second row of contacts being configured to electrically couple to a row of pads of a USB-compatible plug when the USB-compatible plug is inserted into the chamber in the direction, and at least one protrusion on the second inner surface, the at least one protrusion extending against the direction to exceed the first row of contacts.

30 Claims, 28 Drawing Sheets

U.S. PATENT DOCUMENTS

| | | | |
|---|---|---|---|
| 2004/0070952 | A1 | 4/2004 | Higuchi et al. |
| 2005/0094364 | A1 | 5/2005 | Chang et al. |
| 2005/0189426 | A1 | 9/2005 | Nishizawa et al. |
| 2005/0230484 | A1 | 10/2005 | Cuellar et al. |
| 2005/0281010 | A1 | 12/2005 | Wang et al. |
| 2006/0049265 | A1 | 3/2006 | Ho |
| 2006/0053241 | A1 | 3/2006 | Lin |
| 2006/0226222 | A1 | 10/2006 | Yu et al. |
| 2007/0145154 | A1 | 6/2007 | Yu et al. |

FOREIGN PATENT DOCUMENTS

| | | |
|---|---|---|
| JP | 2001 052135 A | 2/2001 |
| JP | 3103771 U | 6/2004 |
| JP | 2007-172630 A | 7/2007 |

OTHER PUBLICATIONS

Office Action for U.S. Appl. No. 11/426,706 dated Feb. 15, 2011.
Office Action for U.S. Appl. No. 11/426,706 dated Aug. 19, 2010.
Office Action for Japanese Application No. 2008-149946 dated Jun. 21, 2011.
Office Action mailed Aug. 17, 2011 in connection with U.S. Appl. No. 11/426,760, filed Jun. 27, 2006.
Office Action for Chinese Application No. 200610168062.9 dated Mar. 23, 2010.
European Search Report for Application No. EP 08 00 9857 dated Oct. 28, 2009.
Clendenin, M., *Taiwan Tips Memory Card Format*, Jan. 31, 2005, Electronic Engineering Times, 1356, pp. 24, 26, and 33.

* cited by examiner

| Pin List | USB | MMC | Mu-bus (8-bit Mode) |
|---|---|---|---|
| 1 | VBUS | VDD | VDD |
| 2 | D- | CMD | EOP |
| 3 | D+ | CLK | CLK |
| 4 | GND | GND | GND |
| 5 | | DAT1 | DAT1 |
| 6 | | DAT0 | DAT0 |
| 7 | | DAT7 | DAT7 |
| 8 | | DAT6 | DAT6 |
| 9 | Card Detect | Card Detect | Card Detect |
| 10 | | DAT5 | DAT5 |
| 11 | | DAT4 | DAT4 |
| 12 | | DAT3 | DAT3 |
| 13 | | DAT2 | DAT2 |

FIG. 6B

| Pin List | USB | MMC/SD | Mu-bus (4-bit Mode) | Mu-bus (1-bit Mode) |
|---|---|---|---|---|
| 1 | VBUS | VDD | VDD | VDD |
| 2 | D- | CMD | EOP | DAT0 |
| 3 | D+ | CLK | CLK | CLK (STROBE) |
| 4 | GND | GND | GND | GND |
| 5 | | DAT1 | DAT1 | |
| 6 | | DAT0 | DAT0 | |
| 7 | | DAT7 | | |
| 8 | | DAT6 | | |
| 9 | | Card Detect | Card Detect | |
| 10 | | DAT5 | | |
| 11 | | DAT4 | | |
| 12 | | DAT3/CD | DAT3 | |
| 13 | | DAT2 | DAT2 | |

FIG. 6C

RECEPTACLES FOR REMOVABLE ELECTRICAL INTERFACE DEVICES

CROSS-REFERENCE TO RELATED APPLICATIONS

This application is a continuation-in-part of U.S. patent application Ser. No. 11/426,706, filed Jun. 27, 2006, which claims the benefit of U.S. Provisional Application No. 60/753,328, filed Dec. 22, 2005, which is herein incorporated by reference.

FIELD OF THE INVENTION

The present invention relates generally to a removable electrical interface device and, more particularly, to a receptacle for a removable electrical interface device.

BACKGROUND OF THE INVENTION

A memory card is commonly known as a small portable package containing digital memory, such as an array of non-volatile memories like flash memories, EPROMs, or EEPROMs (electrically erasable and programmable read only memory). Memory cards have gained popularity as a device for storing a substantial amount of bytes of data from personal computers, notebook computers, personal electronic assistants, cellular telephones, cameras and other electronic devices that support removable data storage.

In general, a memory card includes electrical contacts provided from its surface to allow easy connection to and removal from a corresponding receptacle of a host electronic system or device, particularly portable devices. A number of standards for a memory card have been implemented, including the MultiMedia Card ("MMC") by the MultiMedia Card Association ("MMCA") of Cupertino, Calif., and the Secure Digital ("SD") card by the Secure Digital Card Association ("SDA"). An MMC card is a compact, removable memory card for storing and retrieving digital information in small, low power devices. MMC has been used in many mobile electronic applications, such as music players, mobile phones, personal digital assistants (PDAs), digital cameras, voice recorders, and GPS navigation devices. An SD card is a flash memory card, which has been used in portable devices like digital cameras and handheld computers.

Another known standard for a removable memory card, although not limited to memory storage, is the Universal Serial Bus ("USB"). USB is a high-speed serial bus that supports devices such as printers, keyboards, scanners, pointing devices, and PDAs. USB has become a standard within the computer industry as this protocol affords networking of multiple devices with minimal connections and increased user friendliness. USB is currently defined by the Universal Serial Bus Specification, written and controlled by USB Implementers Forum, Inc., a non-profit corporation founded by a group of companies that developed the USB specification. The specification covers all aspects of USB operations, including electrical, mechanical, and communications characteristics and specifications. One significant feature of the USB is that it allows a peripheral device to store information about itself, and to provide such information upon request by the host. This obviates the need for the host, be it a computer, operating system, or application program, to maintain this information for many different devices. Instead, the device itself stores and provides the information.

In the evolution of memory cards, there is a need for memory cards that consume low power and provide higher accessing speed, while retaining backward compatibility with existing protocols such as the aforementioned MMC, SD, and USB specifications, as well as with other protocols such as Memory Stick and XD.

BRIEF SUMMARY OF THE INVENTION

A novel removable memory card standard is disclosed. The standard of the present invention includes both detection schemes and hardware interface compatibility requirements. Furthermore, the novel standard is backward compatible with the MMC, SD, Memory Stick, XD and USB applications.

In accordance with an embodiment of the present invention, there is provided a receptacle device for an electrical interface device, the electrical interface device being capable of transferring data to and from a host and being adapted to operate in one of a universal serial bus (USB)-compatible mode, a Mu mode (i.e., digital USB mode or USB high-speed inter-chip mode) and a non-USB-compatible mode, the receptacle comprising a housing including a first inner surface and a second inner surface, the first inner surface being opposed to the second inner surface, a chamber defined by the first inner surface and the second inner surface of the housing, a first row of contacts arranged at the first inner surface, the first row of contacts being capable of electrically coupling a first row of pads of the electrical interface device, the first row of pads of the electrical interface device being configured to support one of the USB-compatible mode operation and a 1-bit Mu mode operation, a second row of contacts arranged at the first inner surface, the second row of contacts being capable of electrically coupling a row of pads of a USB-compatible plug, the row of pads of the USB-compatible plug being configured to support the USB-compatible mode operation, and at least one protrusion on the second inner surface, the at least one protrusion being arranged to prevent the first row of contacts from an unauthorized contact.

Still in accordance with the present invention, there is provided a receptacle device for an electrical interface device, the electrical interface device being capable of transferring data to and from a host and being adapted to operate in one of a universal serial bus (USB)-compatible mode, a Mu mode and a non-USB-compatible mode, the receptacle comprising a chamber defined by a first inner surface and a second inner surface, the first inner surface being opposed to the second inner surface, a first row of contacts arranged at the first inner surface, the first row of contacts being configured to electrically couple to a first row of pads of the electrical interface device when the electrical interface device is inserted into the chamber in a direction, a second row of contacts arranged at the first inner surface, the second row of contacts being configured to electrically couple to a row of pads of a USB-compatible plug when the USB-compatible plug is inserted into the chamber in the direction, and at least one protrusion on the second inner surface, the at least one protrusion extending against the direction to exceed the first row of contacts.

Yet still in accordance with the present invention, there is provided a receptacle device for an electrical interface device, the electrical interface device being capable of transferring data to and from a host and being adapted to operate in one of a universal serial bus (USB)-compatible mode, a Mu mode and a non-USB-compatible mode, the receptacle comprising a chamber defined by a first inner surface and a second inner surface, the first inner surface being opposed to the second inner surface, a first row of contacts arranged at the first inner surface, the first row of contacts being configured to electrically couple to a first row of pads of the electrical interface device when the electrical interface device is inserted into the chamber in a direction, and at least one protrusion on the second inner surface, the at least one protrusion extending against the direction to exceed the first row of contacts.

It is to be understood that both the foregoing general description and the following detailed description are exemplary and explanatory only and are not restrictive of the invention, as claimed.

The accompanying drawings, which are incorporated in and constitute a part of this specification, illustrate one embodiment of the present invention and together with the description, serve to explain the principles of the invention.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the Drawings:

FIG. 6B is a pin assignment chart for the electrical interface device illustrated in FIG. 6A;

FIG. 6C is another pin assignment chart for the electrical interface device illustrated in FIG. 6A;

DETAILED DESCRIPTION OF THE INVENTION

In this detailed description, for purposes of explanation, numerous specific details are set forth to illustrate embodiments of the present invention. One skilled in the art will appreciate, however, that embodiments of the present invention may be practiced without these specific details. In other instances, structures and devices are shown in block diagram form. Furthermore, one skilled in the art can readily appreciate that the specific sequences in which methods are presented and performed are illustrative and it is contemplated that the sequences can be varied and still remain within the spirit and scope of embodiments of the present invention.

Figure 1A:
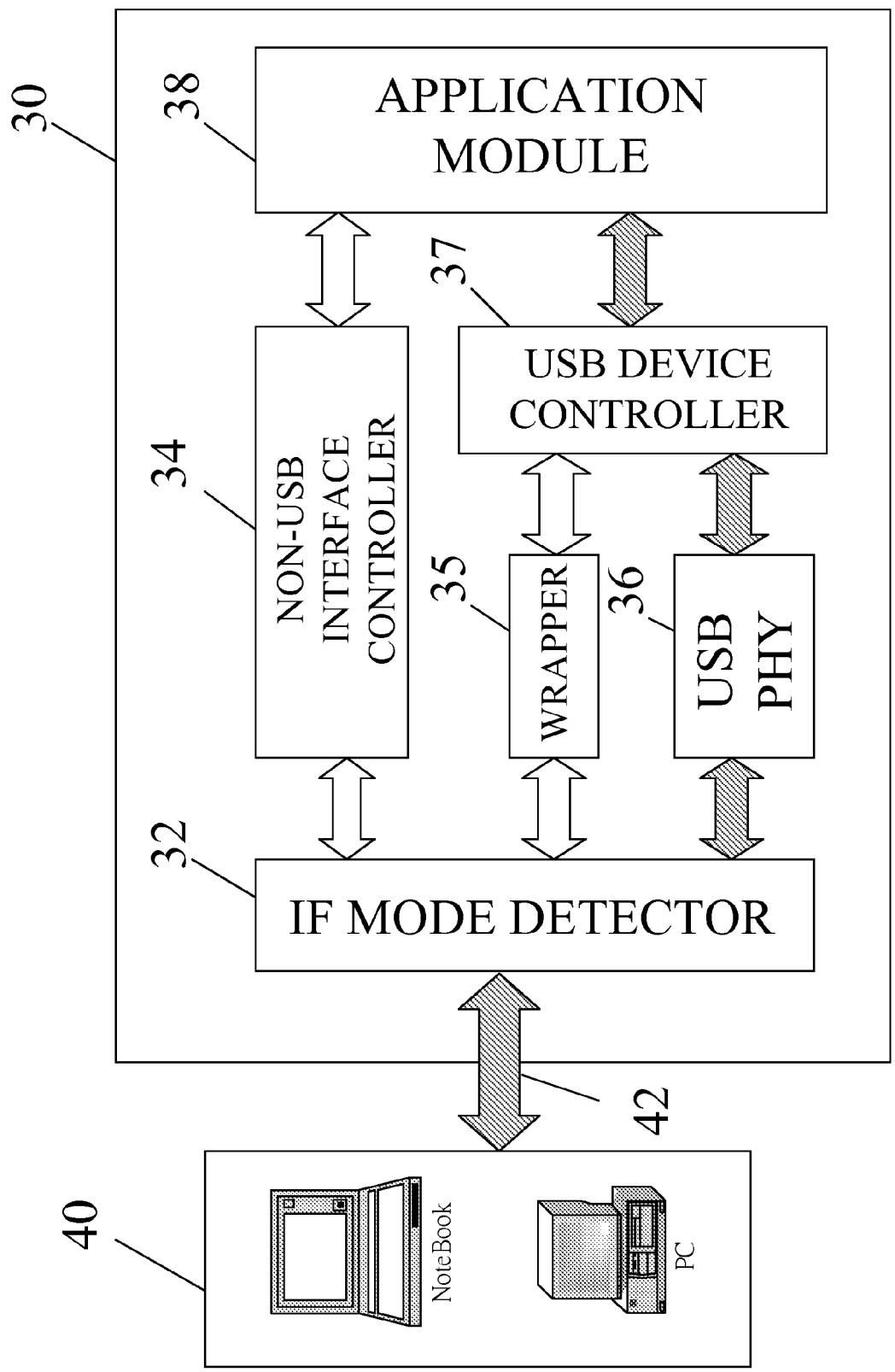
FIGS. 1A, 1B and 1C are functional block diagrams of general applications of an electrical interface device in accordance with one embodiment of the present invention.
Figure 1B:
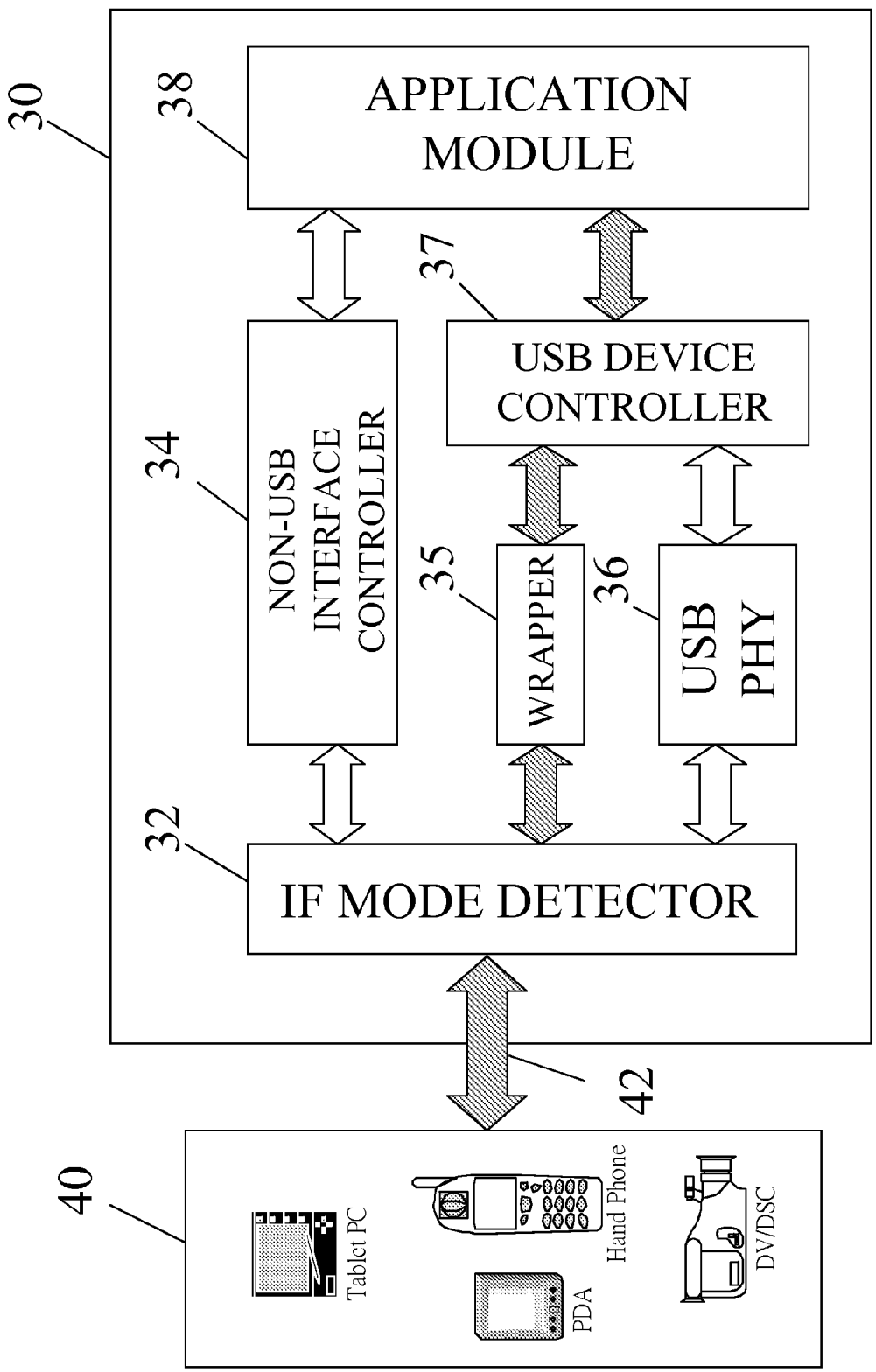
Figure 1C:
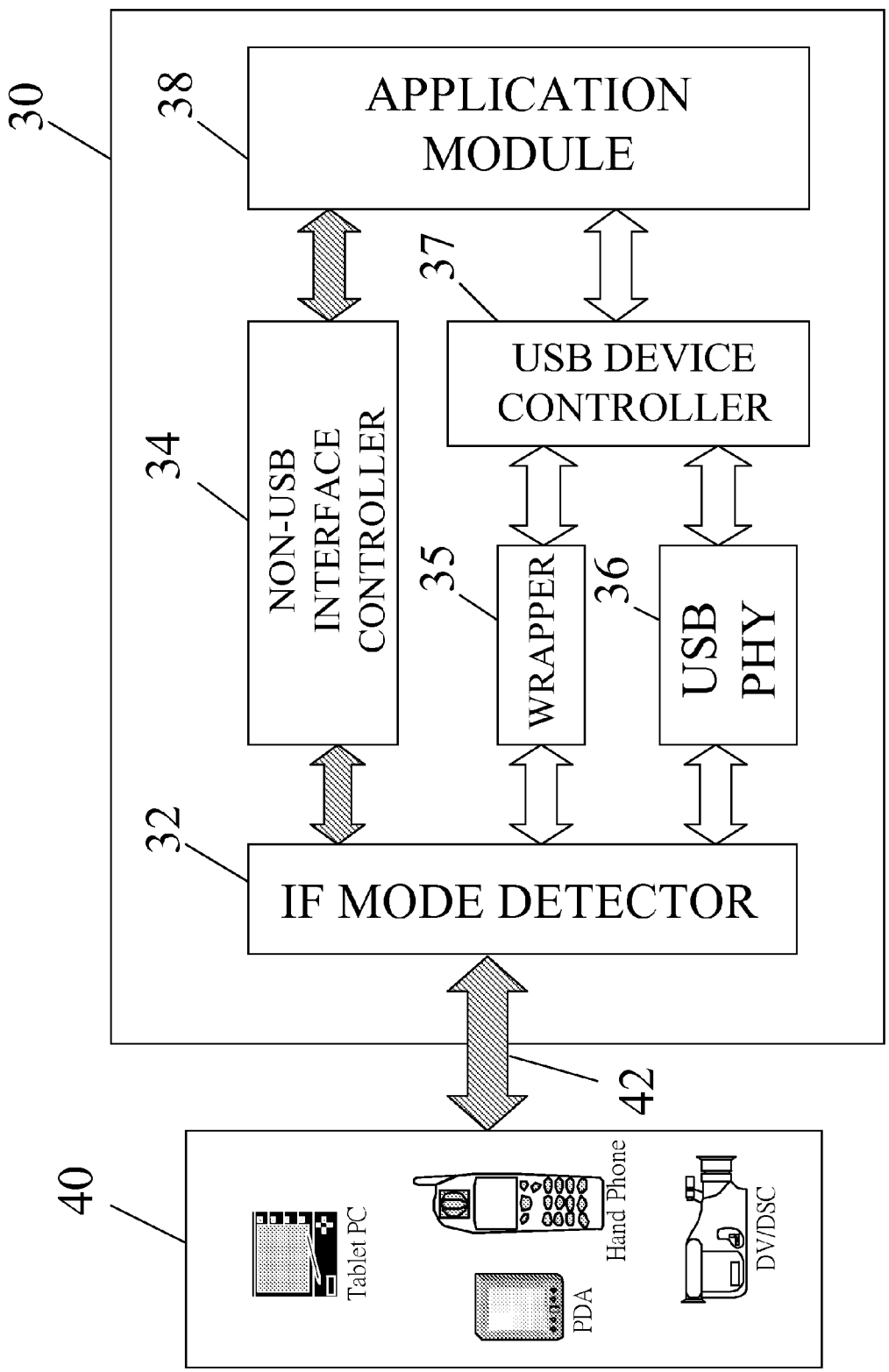

FIGS. 1A, 1B and 1C are functional block diagrams of general applications of a removable electrical interface device 30 in accordance with one embodiment of the present invention. Electrical interface device 30 is able to support several modes of operations, such as those compatible with USB applications, at least one of non-USB applications, including MMC, CF (compact flash), SM (smart media), Memory Stick, XD and SD (security digital) applications, and Mu applications. A Mu application refers to a digital-parallel USB bus, which supports a low-power interface for mobile applications. The Mu card device and interface have been disclosed in U.S. patent application Ser. No. 11/190,233, entitled "Removable Electronic Device and Method Thereof", filed Jul. 27, 2005, and U.S. patent application Ser. No. 11/190,230, entitled "Interface for a Removable Electronic Device", filed Jul. 27, 2005, which are herein incorporated by reference. The USB-compatible mode, for example, includes USB 2.0 application, and the MMC compatible mode includes one of MMC 4.0 or MMC SPI (serial-peripheral interface) applications.

The electrical interface device 30 includes a 1-, 4-, 8- or 16-bit interface, and provides low voltage support of 5V/3.3V/1.8V, with zero power consumption during standby. In addition, electrical interface device 30 is able to support a wide bandwidth from approximately 50 KB/sec to 120 MB/sec. In contrast, MMC 4.0 supports 1-, 4- or 8-bit data transfer at a maximum speed of 52 MB/sec, and USB 2.0 supports data transfer at a maximum speed of 60 MB/sec. Consequently, electrical interface device 30 provides high-speed applications while retaining backward compatibility with at least USB, MMC and MMC SPI applications.

FIG. 1A is a functional block diagram of electrical interface device 30 operating in a USB mode. Referring to FIG. 1A, electrical interface device 30 includes an interface (IF) mode detector 32, a non-USB interface controller 34, a wrapper 35, a universal serial bus (USB) physical layer (PHY) circuit 36, a USB device controller 37, and an application module 38. IF mode detector 32 detects a mode of operation to distinguish among a non-USB mode, a USB mode, or a Mu mode when electrical interface device 30 is inserted into a host 40. Host 40 such as, for example, a notebook, a personal computer (PC), a cell phone, a tablet PC, a PDA or a DV/DSC, may include a card reader (not shown) for receiving electrical interface device 30. In the present embodiment, IF mode detector 32 detects whether a host 40, to which electrical interface device 30 is connected, is in compliance with the USB specifications. USB device controller 37 controls data transfer over a common bus 42 between host 40 and application module 38 via USB PHY circuit 36. Application module 38 functions to serve as a memory storage or an input/output (I/O) interface, depending on the mode of operation detected.

FIG. 1B is a functional block diagram of electrical interface device 30 operating in a Mu mode. Referring to FIG. 1B, IF mode detector 32 detects whether a host 40, to which electrical interface device 30 is connected, is in compliance with the Mu specifications. USB device controller 37 controls data transfer between host 40 and application module 38 via wrapper 35. Wrapper 35, which wraps a call to a function or program inside another function or program, functions to convert 16-bit data into serial data recognizable by USB device controller 37, or vice versa. As such, wrapper 35 functions to bridge between a Mu bus and a UTMI (USB 2.0 Transceiver Macrocell Interface) bus. UTMI, which has been developed to define the interface specifications of the physical layer circuits and part of the logical layer circuits of the USB 2.0, enables a data transfer rate of 480 Mbps in high-speed (HS) mode, which is significantly higher than that of the USB 1.1, while maintaining backward compatibility with the USB 1.1 standard.

FIG. 1C is a functional block diagram of electrical interface device 30 operating in a non-USB mode. Referring to FIG. 1C, IF mode detector 32 detects whether a host 40, to which electrical interface device 30 is connected, is in compliance with one of the non-USB specifications. The non-USB interface controller 34 controls data transfer between host 40 and application module 38. The non-USB application includes, but is not limited to, one of MMC 4.0, a 1-, 4- or 8-bit interface, and MMC SPI, a 1-bit interface.

Figure 2:
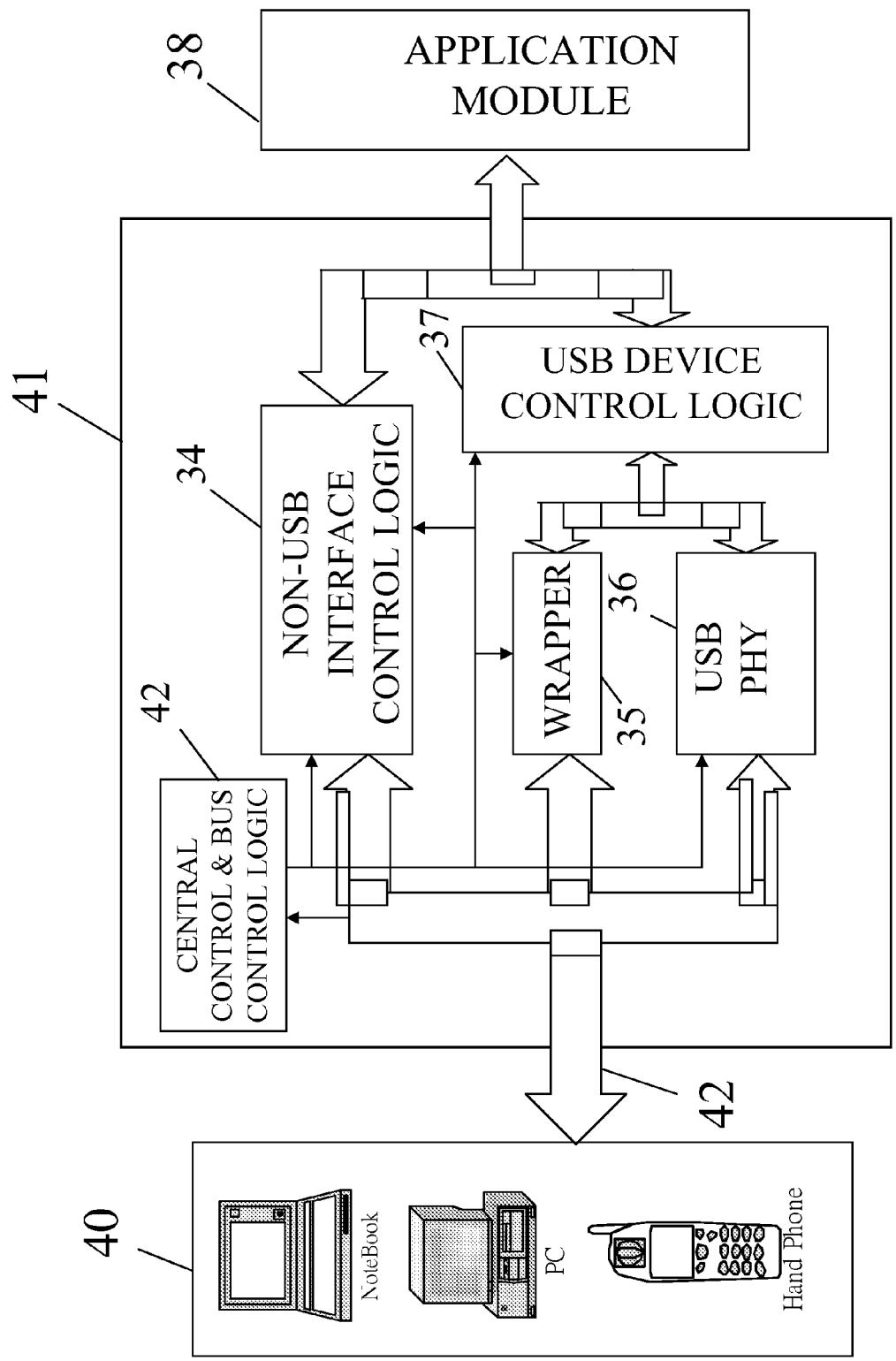
FIG. 2 is a functional block diagram of the general applications of an electrical interface device in accordance with another embodiment of the present invention.

FIG. 2 is a functional block diagram of general applications of an electrical interface device 41 in accordance with another embodiment of the present invention. Referring to FIG. 2, electrical interface device 41 controls data transfer between host 40 and application module 38. Electrical interface 41 includes a similar structure to that of the electrical interface device 30 illustrated in FIGS. 1A, 1B and 1C except that IF mode detector 32 is eliminated and a control unit 42 is added. Control unit 42 further includes a central control logic (not shown) for controlling system operations such as data and command transmission. Control unit 42 also includes a bus control logic (not shown) for selecting one of non-USB interface controller 34, wrapper 35 and USB PHY circuit 36 for communicating with host 40 over common bus 42.

FIGS. 3A to 3D are diagrams of electrical interface devices in accordance with embodiments of the present invention. An electrical interface device according to the present invention is compatible with the USB Standard-A for connection with and removable from a USB Standard-A receptacle. USB connectors may be generally classified as Standard-A and Standard-B connectors. A Standard-A plug is oriented upstream towards a host system, while a Standard-B plug is oriented downstream towards a USB device. A Standard-A receptacle is downstream output from a USB host or hub, while a Standard-B receptacle is upstream input to a USB device or hub.

Figure 3A:
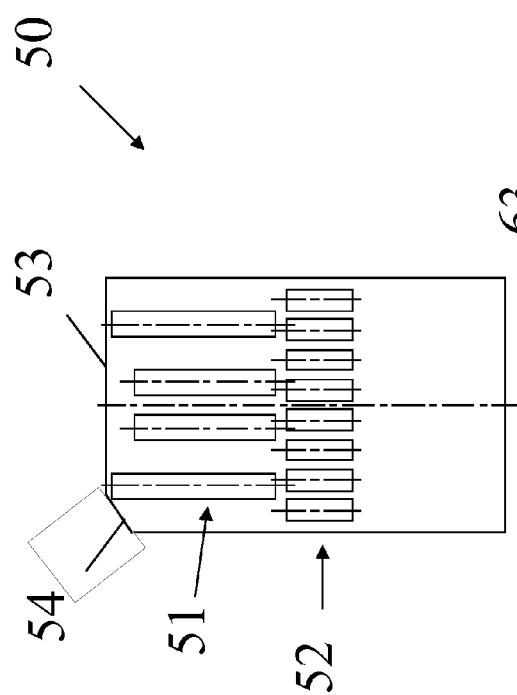
FIGS. 3A to 3D are diagrams of electrical interface devices in accordance with embodiments of the present invention.

Referring to FIG. 3A, an electrical interface device 50 includes a first row of contact pads 51 and a second row of contact pads 52. The first row of contact pads 51, disposed near one side 53 of electrical interface device 50, is provided for connection with or removal from a USB Standard-A receptacle at one side 53. The second row of contact pads 52, disposed close to the first row of contact pads 51, is provided for the Mu interface or the non-USB interface communications. The second row of contact pads 52 supports a 4- or 8-bit bus in an interleaving format. The electrical interface device 50 includes a notch 54 on the upper left-hand corner to prevent incorrect insertion of the electrical interface device 50. Alternatively, the electrical interface device 50 includes a notch on the upper right-hand corner to prevent incorrect insertion.

Figure 3B:
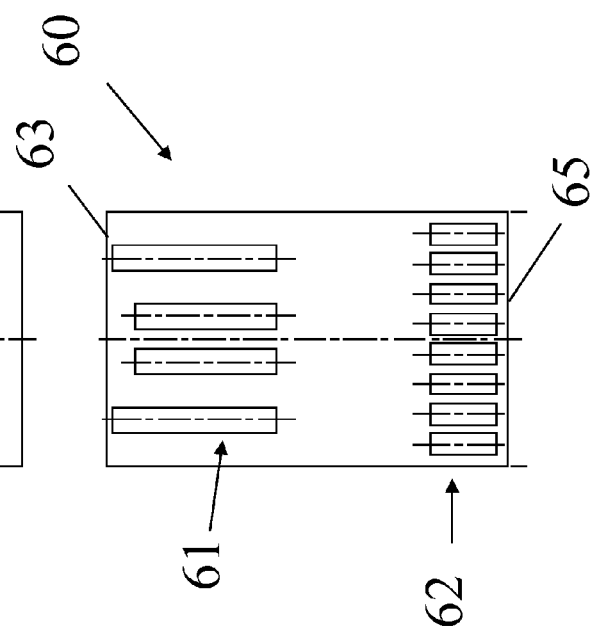

Referring to FIG. 3B, an electrical interface device 60 has a similar structure to that of the electrical interface device 50 shown in FIG. 3A, except that a second row of contact pads 62 is disposed at another side 65 of electrical interface device 60. With a first row of contact pads 61 disposed at one side 63 and a second row of contact pads 62 disposed at another side 65, electrical interface device 60 is allowed to connect to a host device at either side 63 or side 65.

Figure 3C:
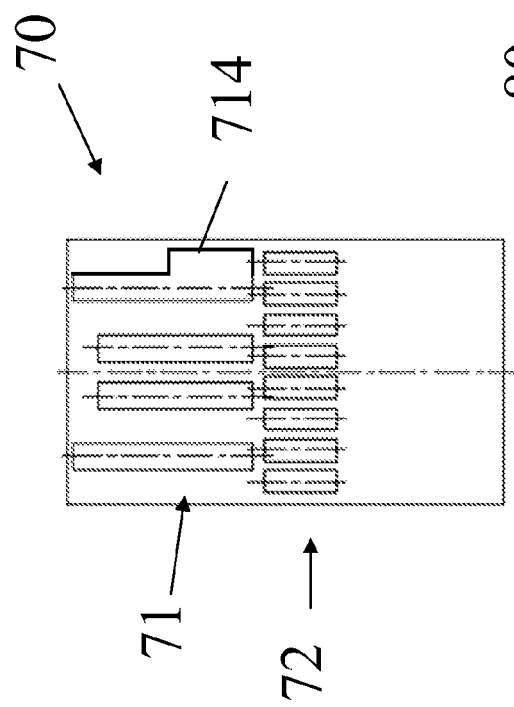

Referring to FIG. 3C, an electrical interface device 70 has a similar structure to that of the electrical interface device 50 shown in FIG. 3A, except that a contact pad 714 of a first row of contact pads 71 has a larger area to facilitate card detection. In one embodiment according to the present invention, contact pad 714 is electrically grounded or connected to a reference voltage level, and is pulled high when electrical interface device 50 is inserted into a host. A second row of contact pads 72 is disposed close to the first row of contact pads 71.

Figure 3D:
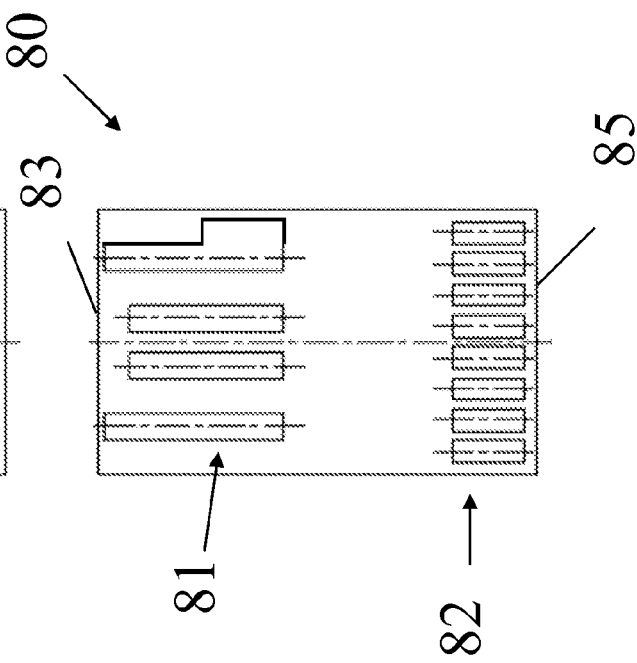

Referring to FIG. 3D, an electrical interface device 80 has a similar structure to that of the electrical interface device 70 shown in FIG. 3C, except that a second row of contact pads 82 is disposed at another side 85 of electrical interface device 80. With a first row of contact pads 81 disposed at one side 83 and a second row of contact pads 82 disposed at another side 85, electrical interface device 80 is allowed to connect to a host device at either side 83 or side 85.

Figures 4A, 4B:
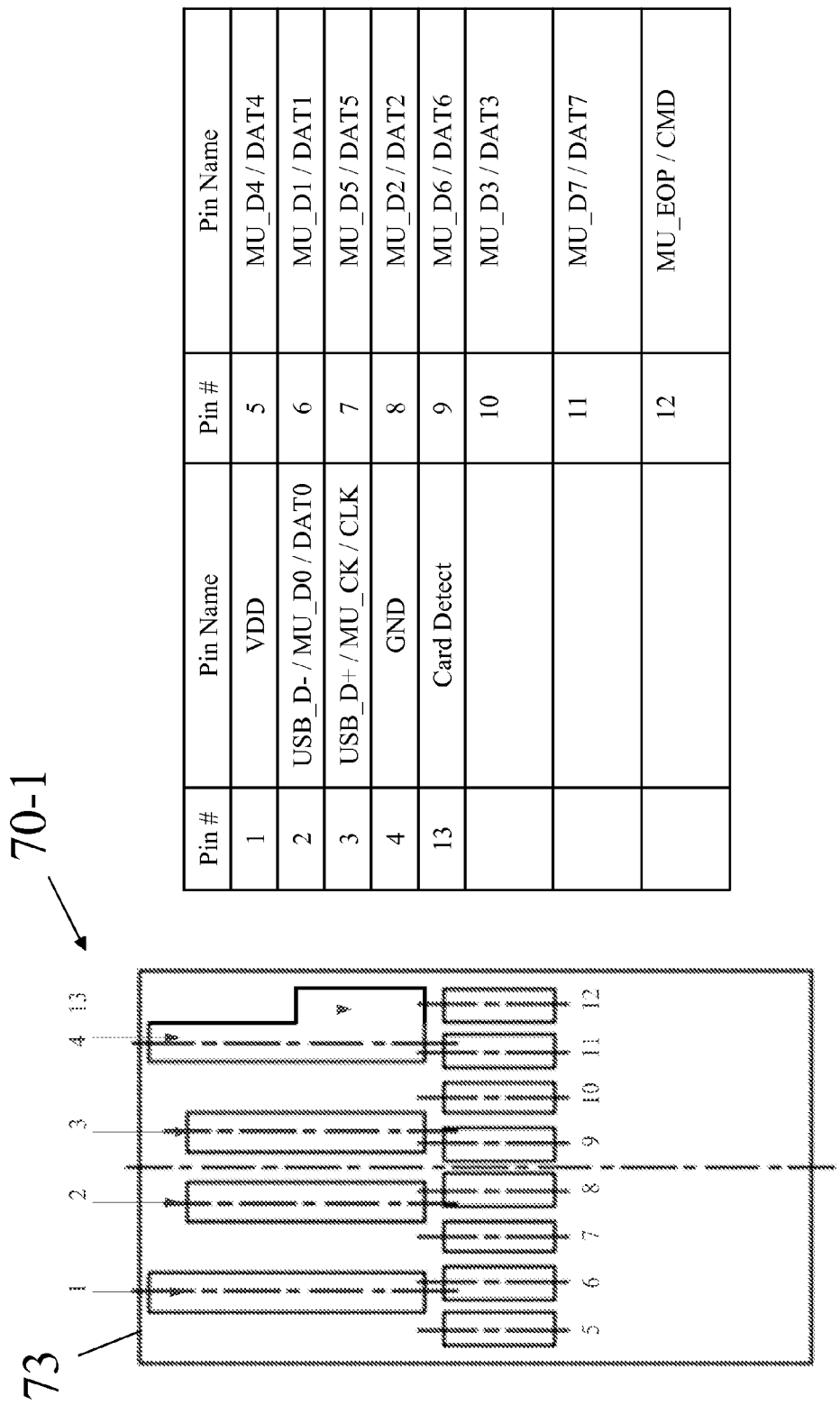
FIG. 4A is a pin arrangement of an electrical interface device in accordance with one embodiment of the present invention.
FIG. 4B is a pin assignment chart of the electrical interface device illustrated in FIG. 4A.

FIG. 4A is a pin layout of an electrical interface device 70-1 in accordance with one embodiment of the present invention. Referring to FIG. 4A, the electrical interface device 70-1, having a similar structure to that of the electrical interface device 70 illustrated in FIG. 3C, includes a first row of pins numbered 1 to 4 and 13 for the USB Standard-A interface communications, and a second row of pins numbered 5 to 12 for the Mu and the non-USB interface communications.

FIG. 4B is a pin assignment chart of the electrical interface device 70-1 illustrated in FIG. 4A. Referring to FIG. 4B, the pin numbered 4 is electrically grounded or connected to a reference voltage level. The pin numbered 13, which is incorporated with the pin numbered 4 in a contact pad, serves as a card detection pin to identify the Mu interface mode or the non-USB interface mode. In one embodiment according to the present invention, a command format for the non-USB interface mode such as, for example, an MMC interface mode, is "40h, 00h, 00h, 00h, 00h, 95h", while a command format for the Mu interface mode is one different from the MMC command format. The pin numbered 4 is disposed closer to a side 73 of the electrical interface device 70-1 than the pin numbered 13 such that the voltage level of the pin numbered 13 is not pulled high until electrical interface device 70-1 is inserted to a host from side 73.

Figures 5A, 5B:
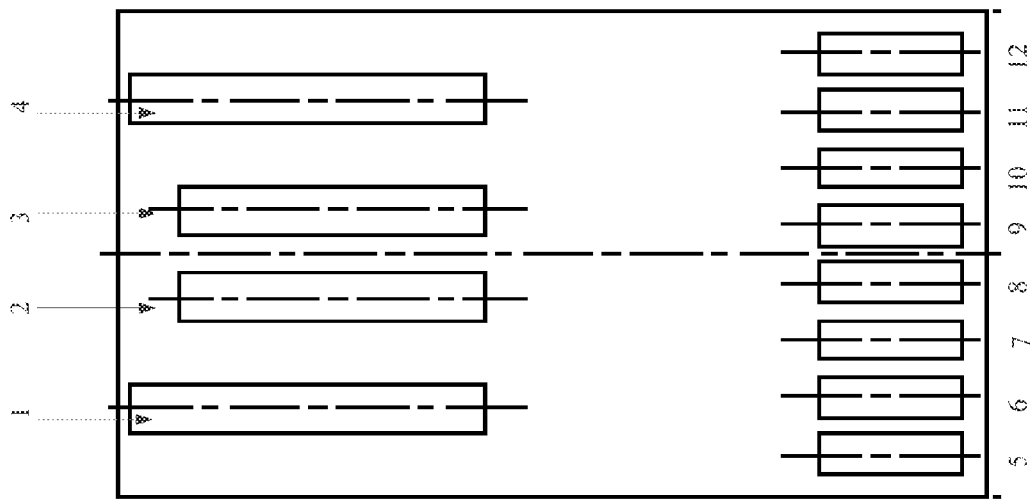
FIG. 5A is a pin arrangement of an electrical interface device in accordance with another embodiment of the present invention.
FIG. 5B is a pin assignment chart of the electrical interface device illustrated in FIG. 5A.

FIG. 5A is a pin arrangement of an electrical interface device 60-1 in accordance with another embodiment of the present invention. FIG. 5B is a pin assignment chart of the electrical interface device 60-1 illustrated in FIG. 5A. Referring to FIG. 5A, the electrical interface device 60-1 includes a similar structure to that of the electrical interface device 60 illustrated in FIG. 3B. Referring to FIG. 5B, the electrical interface device 60-1 includes a first row of pins numbered 1 to 4 for the USB Standard-A interface communications, and a second row of pins numbered 5 to 12 for the Mu and the non-USB interface communications.

Figure 6A:
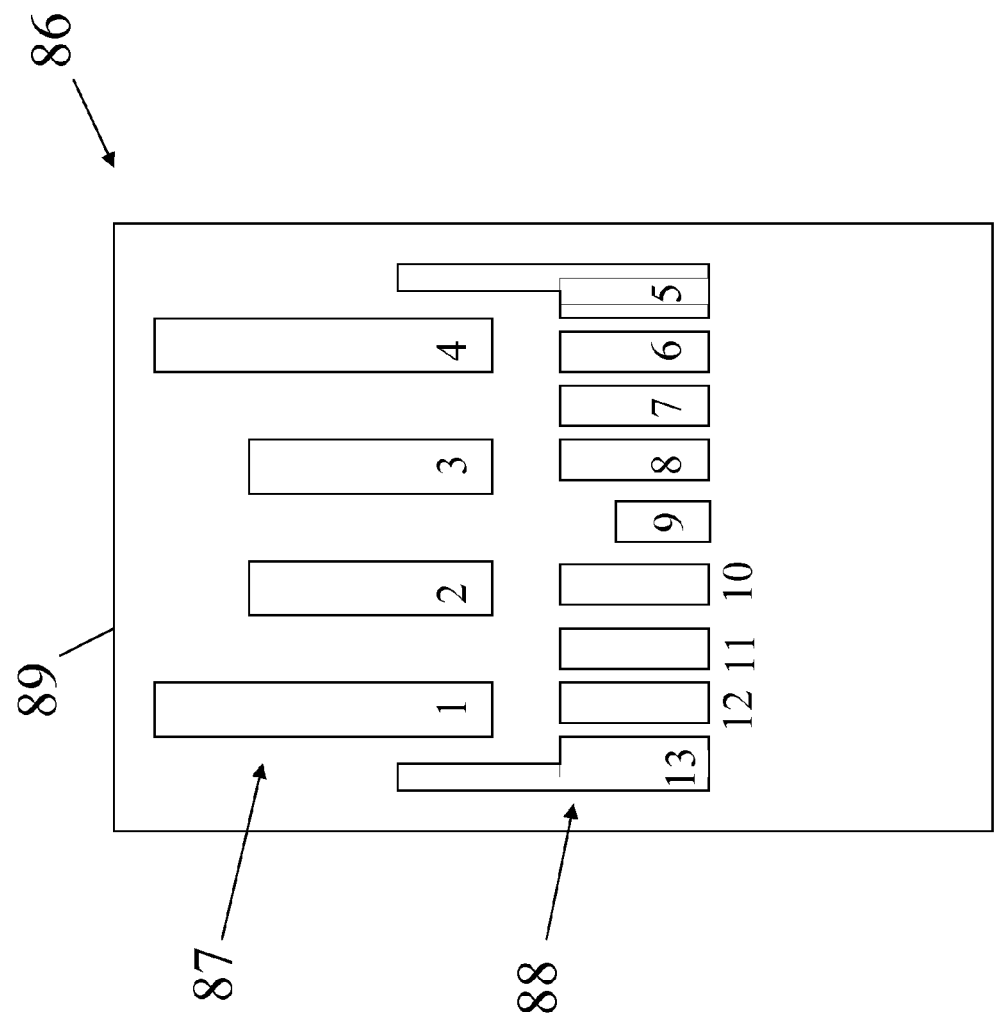
FIG. 6A is a pin arrangement of an electrical interface device in accordance with still another embodiment of the present invention.

FIG. 6A is a pin arrangement of an electrical interface device 86 in accordance with one embodiment of the present invention. FIG. 6B is a pin assignment chart of the electrical interface device 86 illustrated in FIG. 6A. Referring to FIG. 6A, the electrical interface device 86 includes a first row of pins 87 including pins numbered 1 to 4 for the USB Standard-A interface communications, and a second row of pins 88 including pins numbered 5 to 13 for the Mu and the non-USB interface communications. Pins numbered 13 and 5 of the second row of pins 88 extend toward a side 89 of electrical interface device 86 and past one end (not numbered) of each of pins numbered 1 and 4 of first row of pins 87, respectively. The extending portions of pins numbered 13 and 5 may improve signal shielding for electrical interface device 86. The pin numbered 9, also referring to FIG. 6B, serves as a card detection pin. Pin 9 is disposed farther than other pins of the second row of pins 88 to side 89 such that pin 9 is the last pin to electrically contact a host when electrical interface device 86 is inserted into the host. As a result, electrical interface device 86 is not powered on and therefore will not be destroyed by a power-on voltage if electrical interface device 86 is incorrectly inserted to the host.

Referring to FIG. 6B, the first row of pins 1 to 4 not only supports the USB Standard-A connection when electrical interface device 86 illustrated in FIG. 6A operates in the USB mode, but also supports the Mu mode and non-USB mode connection when electrical interface device 86 operates in the Mu mode and the non-USB mode, respectively. In the present embodiment, the Mu mode and non-USB mode may each include an 8-bit mode, wherein pins 5 to 8 and 10 to 13 may be configured for data transmission.

FIG. 6C is another pin assignment chart for the electrical interface device 86 illustrated in FIG. 6A. Referring to FIG. 6C, in addition to the USB mode and the 8-bit non-USB mode, the electrical interface device 86 may be configured to support both 1-bit and 4-bit Mu modes. Specifically, pin 2 may be configured for data transmission in the 1-bit Mu mode, and pins 5, 6, 12 and 13 may be configured for data transmission in the 4-bit Mu mode. Pin 9 optionally may be configured to facilitate card detection.

Figure 7A:
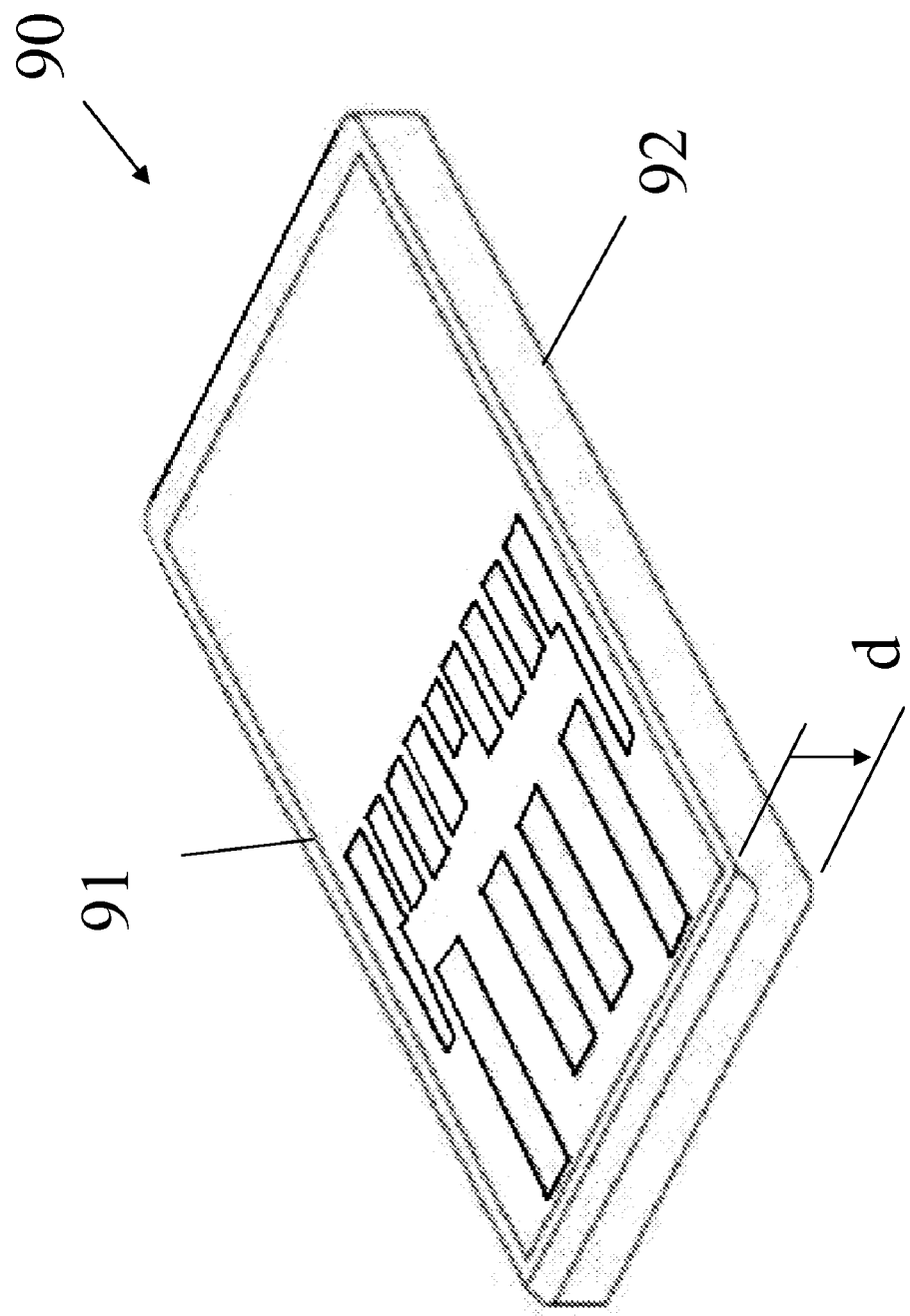
FIG. 7A is a diagram of an electrical interface device in accordance with one embodiment of the present invention.

FIG. 7A is a diagram of an electrical interface device 90 in accordance with one embodiment of the present invention. Referring to FIG. 7A, the electrical interface device 90 includes an electronic card 91 and a carrier 92 into which the electronic card 91 is housed. Electronic card 91 provides substantially the same functions as the electrical interface devices illustrated in the previously discussed embodiments. Carrier 92 includes, but is not limited to, a plastic passive component. In one embodiment, electrical interface device 90 or carrier 92 has a thickness "d" of approximately 1 millimeter (mm), which is suitable for use with small consumer electronics. Alternatively, electrical interface device 90 or carrier 92 has a thickness "d" of approximately 2 mm, which is suitable for use with a USB Standard-A receptacle.

Figure 7B:
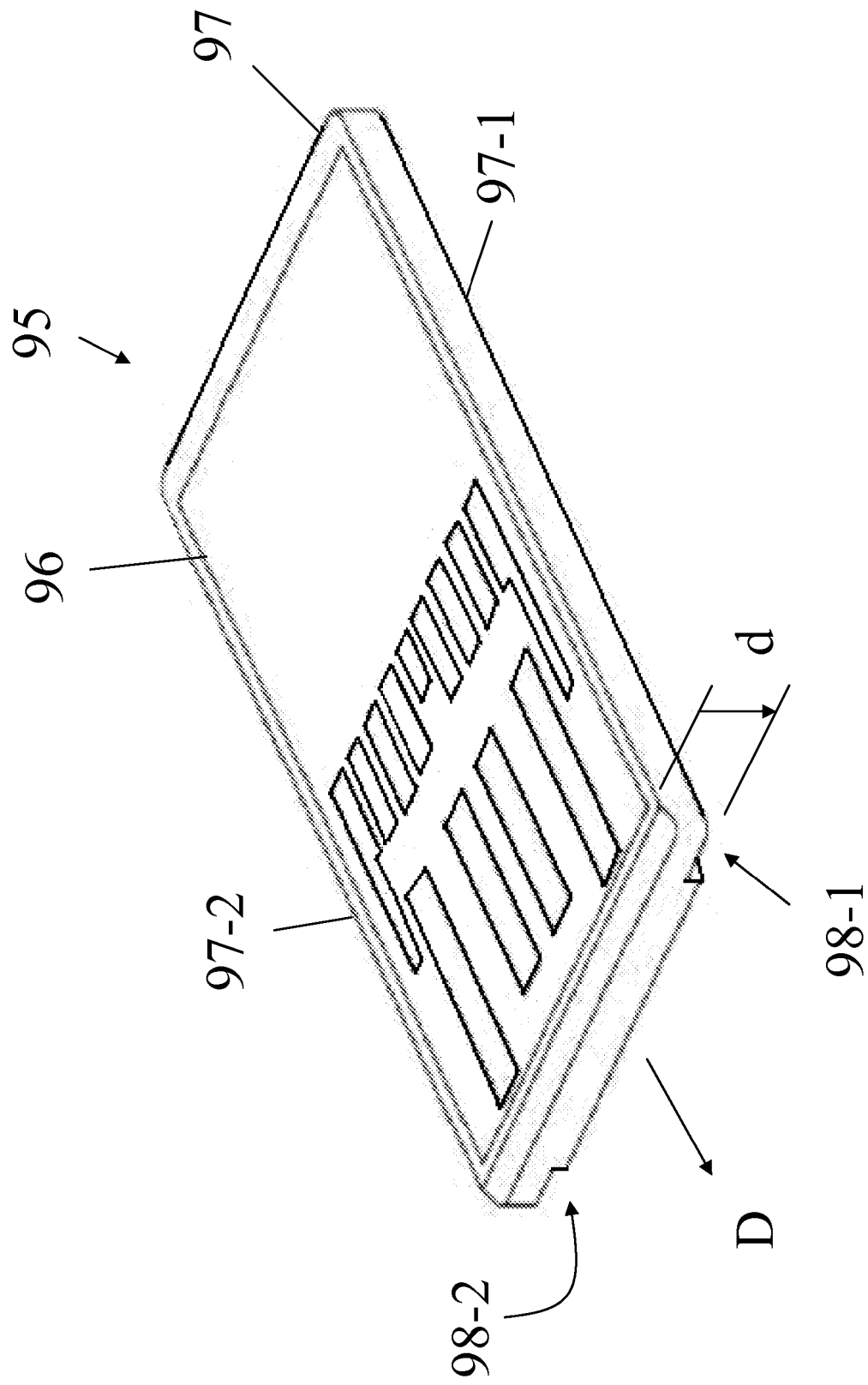
FIG. 7B is a diagram of an electrical interface device in accordance with another embodiment of the present invention.

FIG. 7B is a diagram of an electrical interface device 95 in accordance with another embodiment of the present invention. Referring to FIG. 7B, electrical interface device 95 includes an electronic card 96 and a carrier 97. Carrier 97 includes a first guide trench 98-1 extending substantially in parallel with a first side 97-1 of carrier 97. With first guide trench 98-1, carrier 97 may include a more compact holder (not shown) at a host-side connector (not shown) for receiving electrical interface device 95 in a direction labeled as "D," as compared to the carrier 92 illustrated in FIG. 7A, having the same thickness d. Carrier 97 may further include a second guide trench 98-2 extending substantially in parallel with a second side 97-2 of carrier 97, which further facilitates the compactness of the holder.

Figure 7C:
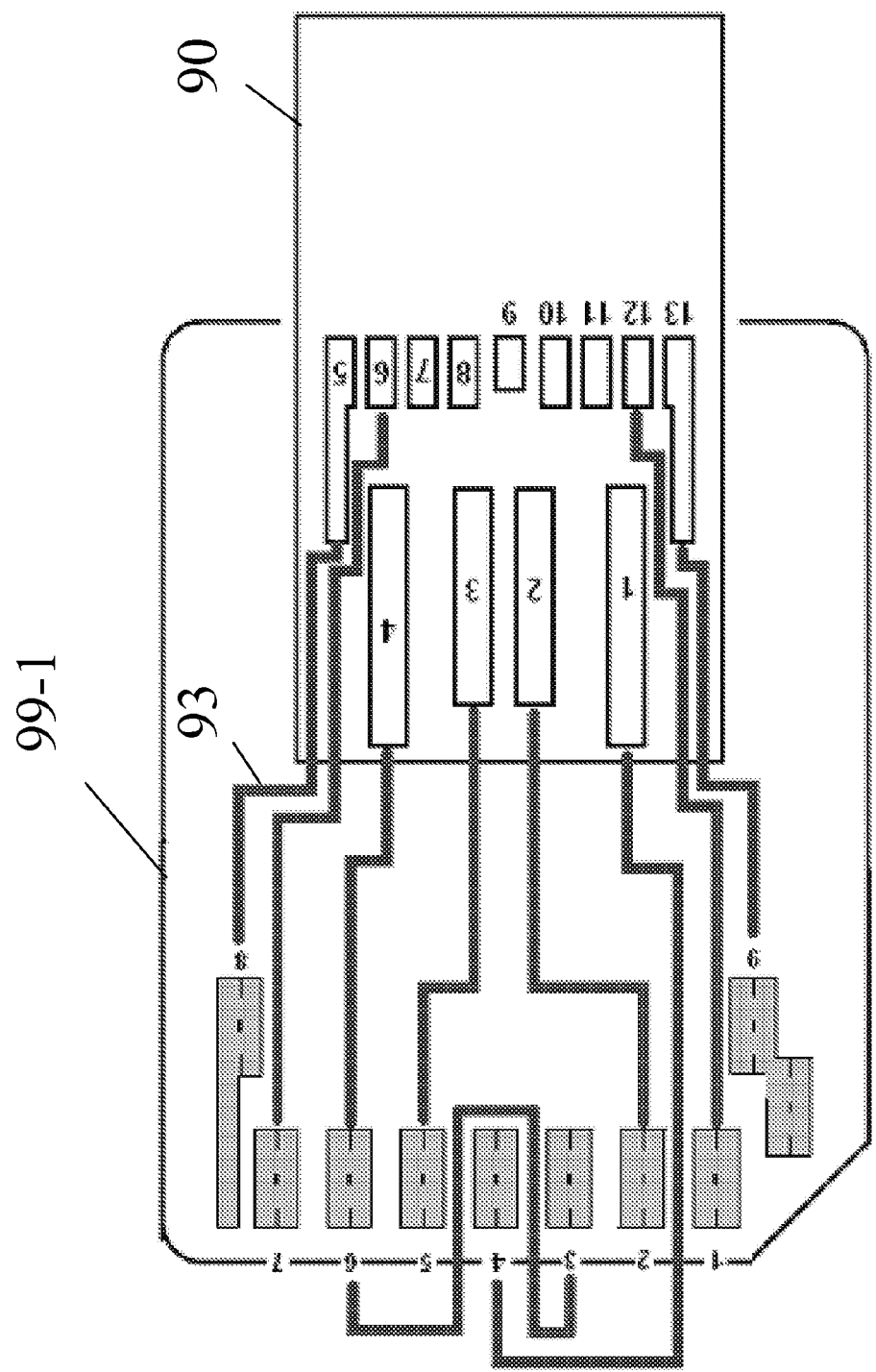
FIG. 7C is a diagram of an adapter for use with the electrical interface device illustrated in FIG. 7A in accordance with one embodiment of the present invention.

FIG. 7C is a diagram of an adapter 99-1 for use with the electrical interface device 90 illustrated in FIG. 7A in accordance with one embodiment of the present invention. Referring to FIG. 7C, adapter 99-1 is capable of receiving electrical interface device 90. Adapter 99-1 is electrically connected to electrical interface device 90 through conductive lines 93 and functions to serve as an MMC card or SD card once electrical interface device 90 is inserted thereto. In the present embodiment, adapter 99-1 supports either a 4-bit MMC or SD connection. Specifically, also referring to the pin assignment chart illustrated in FIG. 6B, each of the four pins 5, 6, 12 and 13 of the second pad row of electrical interface device 90 for MMC or non-USB connection is electrically connected to a corresponding pad of adapter 99-1.

FIG. 7C shows an example of an adapter 99-1 suitable for use with electrical interface device 90. One skilled in the art will recognize that adapter 99-1 is also suitable with the electrical interface device 95 illustrated in FIG. 7B. In that case, adapter 99-1 may be made with a slimmer profile.

Figure 7D:
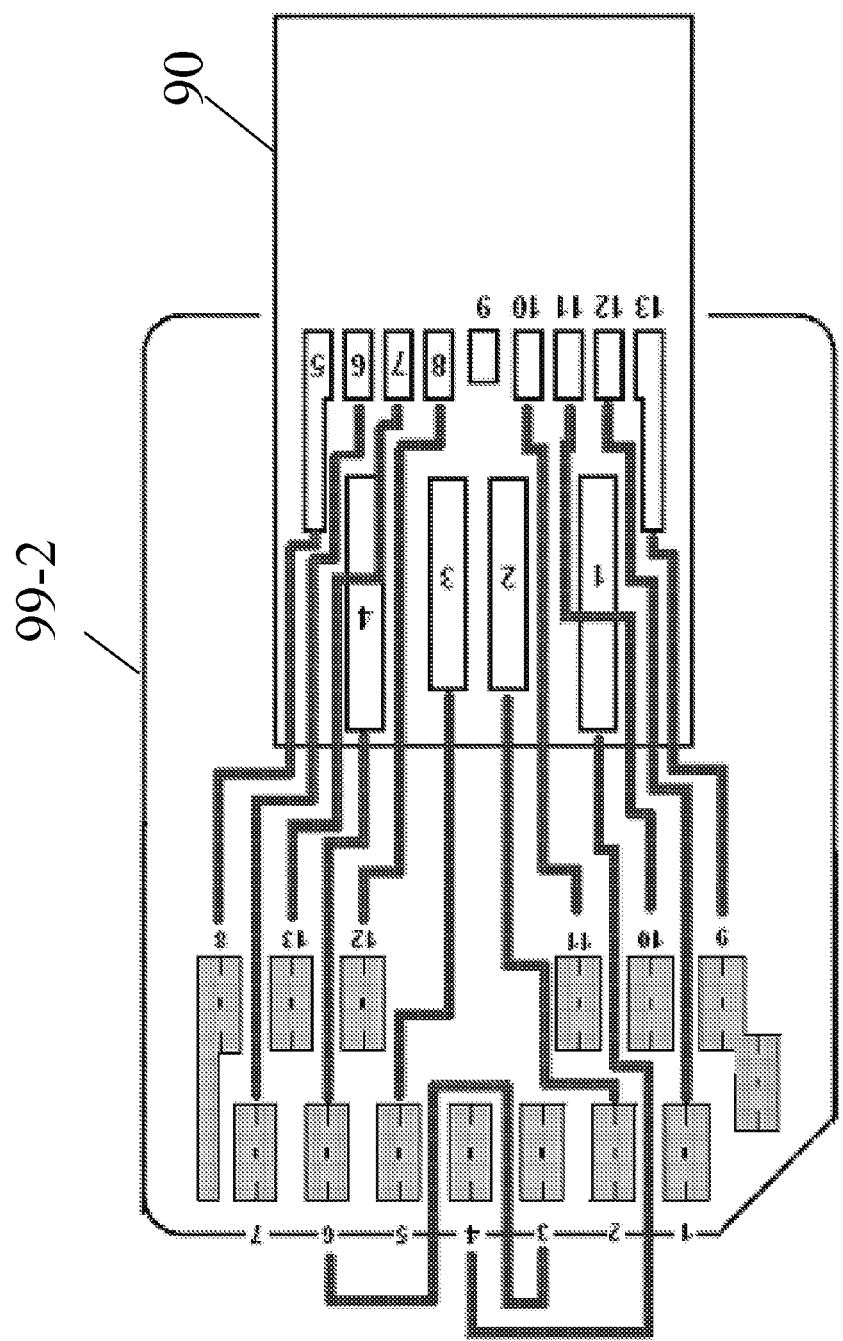
FIG. 7D is a diagram of an adapter for use with the electrical interface device illustrated in FIG. 7A in accordance with another embodiment of the present invention.

FIG. 7D is a diagram of an adapter 99-2 for use with electrical interface device 90 illustrated in FIG. 7A in accordance with another embodiment of the present invention. Referring to FIG. 7D, the adapter 99-2 supports an 8-bit MMC connection. Specifically, also referring to FIG. 6B, each of the eight pins 5 to 8 and 10 to 13 of the second pad row of electrical interface device 90 for MMC or non-USB connection is electrically connected to a corresponding pad of adapter 99-2. Alternatively, adapter 99-2 is suitable for use with the electrical interface device 95 illustrated in FIG. 7B. In that case, adapter 99-2 may be made with a summer profile.

Figures 8A, 8B:
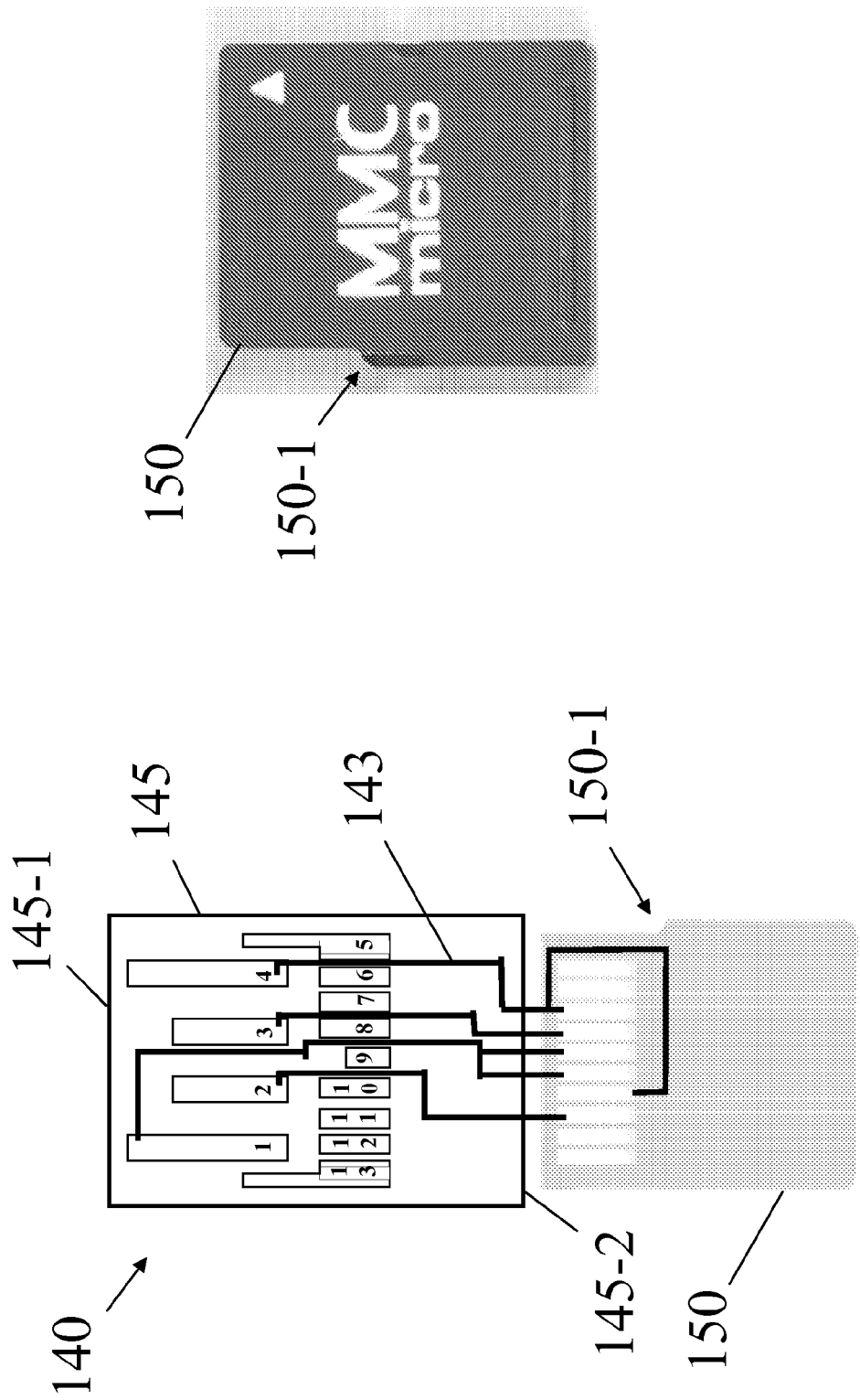
FIG. 8A is a pin layout of an electrical interface device in accordance with one embodiment of the present invention.
FIG. 8B is a schematic top elevational view of a micro memory card suitable for use with the electrical interface device illustrated in FIG. 8A.

FIG. 8A is a pin layout of an electrical interface device 140 in accordance with one embodiment of the present invention. Referring to FIG. 8A, electrical interface device 140 includes an adapter 145 further including a first row of pins numbered 1 to 4 and a second row of pins numbered 5 to 13. The pin assignment and pin arrangement of the pins 1 to 13 of the adapter 145 are similar to those of the electrical interface device 86 illustrated in FIG. 6A and therefore will not be repeated herein. Adapter 145 further includes a first end 145-1 connectable to or removable from a host, and a second side 145-2 for receiving a micro memory card 150. Micro memory card 150, when inserted into adapter 145, is electrically connected to the first and second rows of pins of adapter 145. For simplicity, only conductive lines 143 for establishing electrical connections between the first row of pins 1 to 4 and the micro memory card 150 are illustrated. To prevent incorrect insertion to electrical interface device 140, micro memory card 150 includes an indentation 150-1 on its periphery.

FIG. 8B is a schematic top elevational view of a micro memory card 150 suitable for use with the electrical interface device 140 illustrated in FIG. 8A. Referring to FIG. 8B, micro memory card 150 includes an MMC micro memory card or a micro SD memory card. MMC micro memory card refers to an MMC-compatible card that supports MMC 4.0 applications and has backward compatibility with existing MMC protocols. The MMC micro memory card is relatively small in size, approximately one-fourth the size of a full-size MMC card, and is tailored to fit the increasingly shrinking camera phones and other devices. Micro SD memory card refers to an SD-compatible flash memory card, approximately one-fourth the size of a full-size SD card. Micro SD memory cards are generally used in mobile phones, handheld global positioning system ("GPS") devices and portable audio players.

Figure 8C:
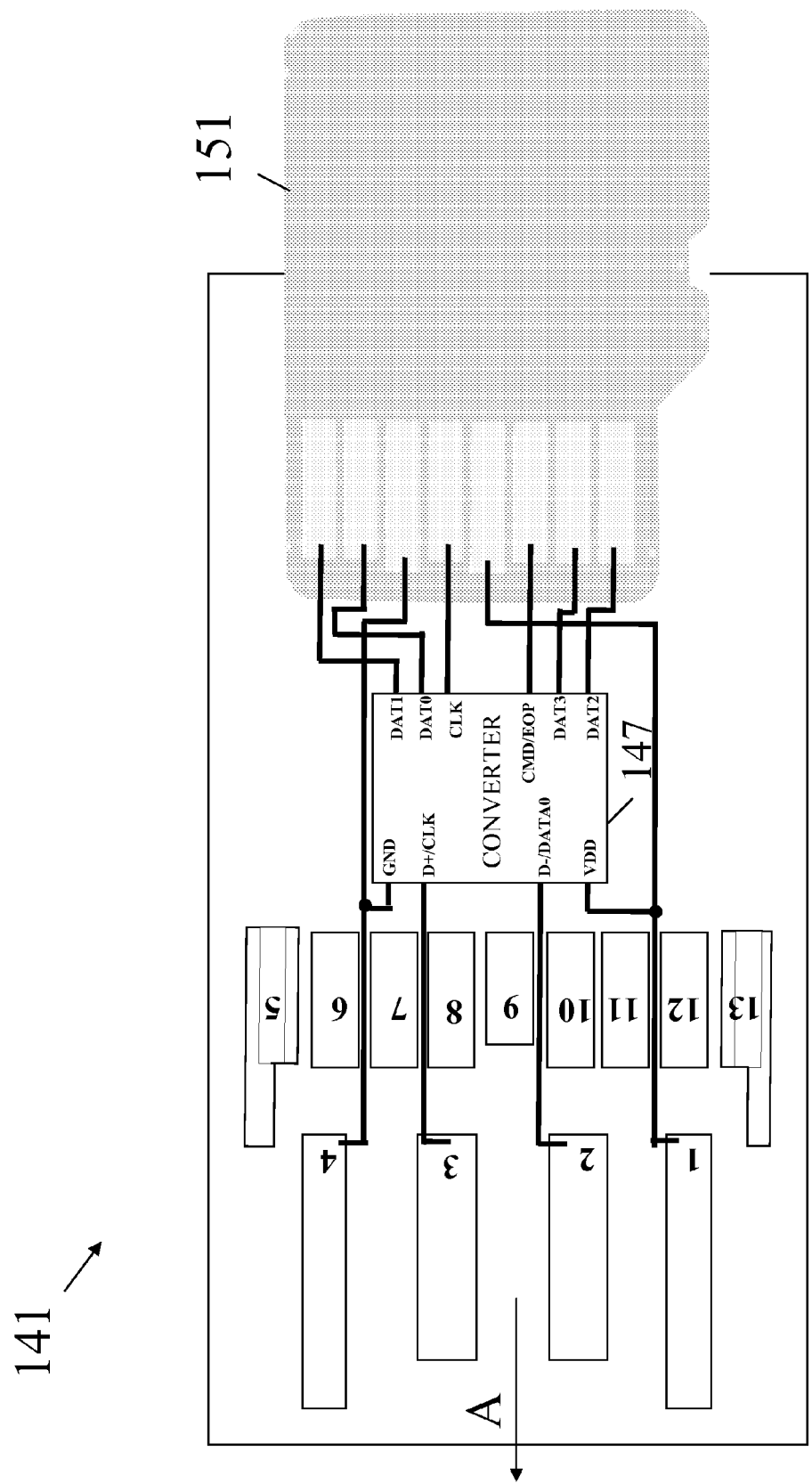
FIG. 8C is an electrical interface device in accordance with another embodiment of the present invention.

FIG. 8C is an electrical interface device 141 in accordance with another embodiment of the present invention. Referring to FIG. 8C, the electrical interface device 141 may have a similar pin arrangement to that of the electrical interface device 140 described and illustrated with reference to FIG. 8A. Furthermore, the electrical interface device 141 may include a converter 147, which may include a number of ports accessible to a receptacle, labeled "GND", "D+/CLK", "D-/DATA0" and "VDD", and a number of ports accessible to a removable device, labeled "CLK", "CMD/EOP" and "DAT0" to "DAT3", of which the port assignment may refer to the pin assignment illustrated in FIG. 6C. In one example, the converter 147 may be configured to convert between a non-USB interface and a USB interface when a removable device 151 such as an MMC card or SD card is inserted to the electrical interface device 141, which in turn is inserted to a receptacle (not shown) in a direction "A" shown. Specifically, when the removable device 151 is coupled through the electrical interface device 141 with a receptacle receiving USB-compatible signals from a host, the ports "D+/CLK" and "D-/DATA0" may perform the "D+" and "D-" functions of the USB-compatible mode, respectively. The converter 147 may convert the "D+/CLK" and "D-/DATA0" signals to "CLK", "CMD/EOP", "DAT0" to "DAT3" signals in order to access the removable device 151.

In another example, the converter 147 may be configured to convert between a non-USB interface and a 1-bit Mu-mode interface when the removable device 151 is inserted in the electrical interface device 141, which in turn is inserted to a receptacle (not shown) in the direction "A". Specifically, when the removable device 151 is coupled through the electrical interface device 141 with a receptacle receiving the 1-bit Mu-mode signals from a host, the ports of "D+/CLK" and "D-/DATA0" may perform the "CLK" (or "STROBE") and "DAT0" functions of the 1-bit Mu mode, respectively. The converter 147 may convert the "D+/CLK", "D-/DATA0" signals to "CLK", "CMD", "DAT0" to "DAT3" signals in order to access the removable device 151. Receptacles capable of supporting the Mu-mode interfaces including 1-bit, 4-bit and 8-bit Mu-mode interfaces will be discussed below by reference to FIGS. 13A to 13D.

Figure 8D:
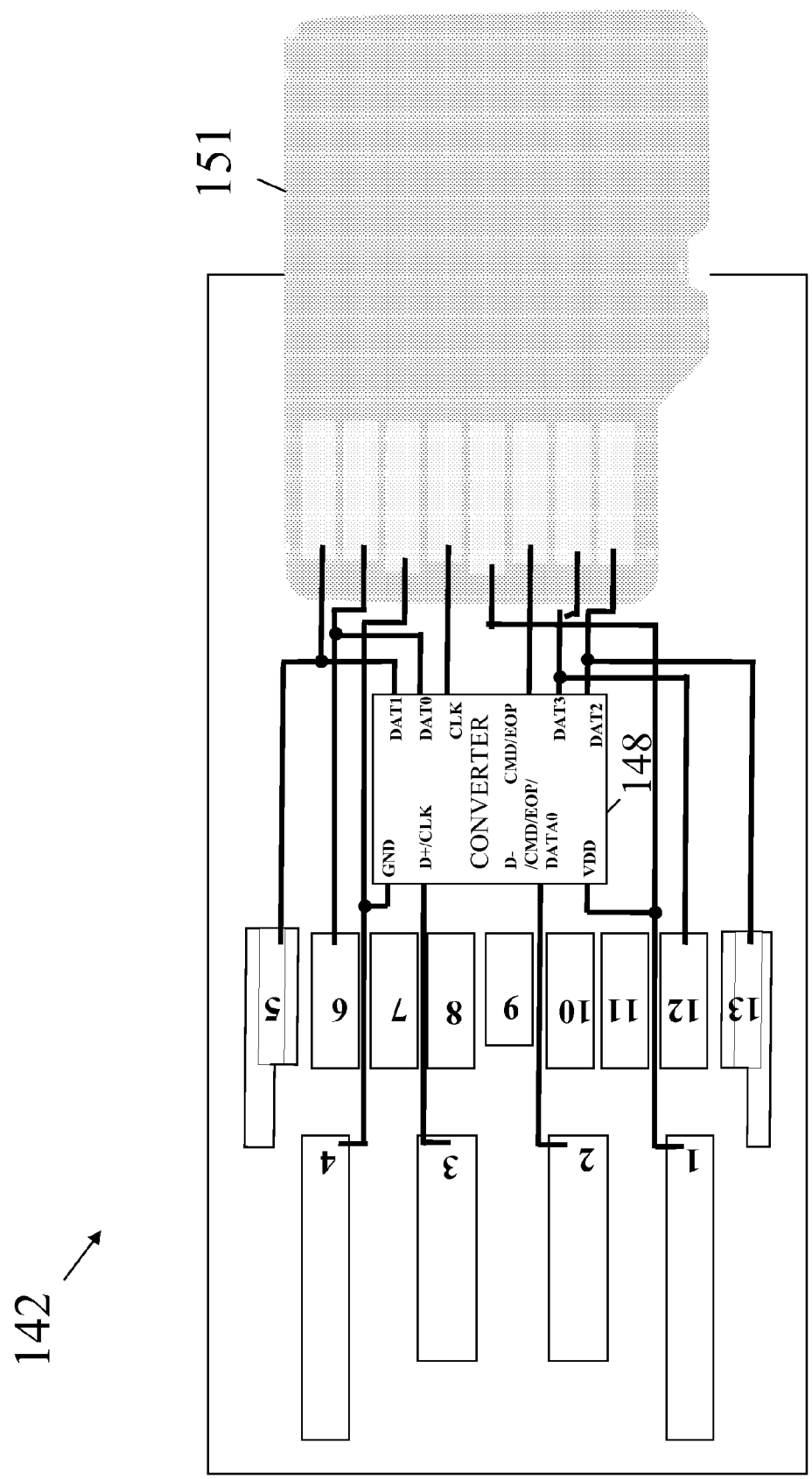
FIG. 8D is an electrical interface device in accordance with yet another embodiment of the present invention.

FIG. 8D is an electrical interface device 142 in accordance with yet another embodiment of the present invention. Referring to FIG. 8D, the electrical interface device 142 may be similar to the electrical interface device 141 described and illustrated with reference to FIG. 8C except that, for example, a portion of the second row of pins numbered 5 to 13 are in use. Furthermore, the electrical interface device 142 may include a converter 148, which may include a number of ports labeled "GND", "D+/CLK", "D-/CMD/EOP/DATA0" and "VDD", and a number of ports labeled "CLK", "CMD/EOP" and "DAT0" to "DAT3". With the second row of pins in use in addition to the first row of pins, the converter 148 may be configured to convert between a non-USB interface and a 4-bit or 8-bit Mu-mode interface in addition to between a non-USB interface and a USB interface and between a non-USB interface and a 1-bit Mu-mode interface. Specifically, when the removable device 151 is coupled with a receptacle receiving the non-USB-compatible signals from a host, the ports "D+/CLK" and "D-/CMD/EOP/DATA0" may perform the "CLK" and "CMD" functions of the non-USB-compatible mode, respectively. When the removable device 151 is coupled with a receptacle receiving the 4-bit or 8-bit Mu-mode signals through the electrical interface device 142, the ports "D+/CLK" and "D-/CMD/EOP/DATA0" may perform "CLK" and "EOP" functions of the 4-bit or 8-bit Mu mode, respectively. In the present example, the pins of the removable device 151 may be active while the ports "DAT0" to "DAT3" may be disabled to avoid data conflict. Furthermore, signals at the ports "CLK" and "CMD/EOP" may be directed to ports, "D+/CLK" and "D-/CMD/EOP/DATA0", respectively, or vice versa.

Figure 9:
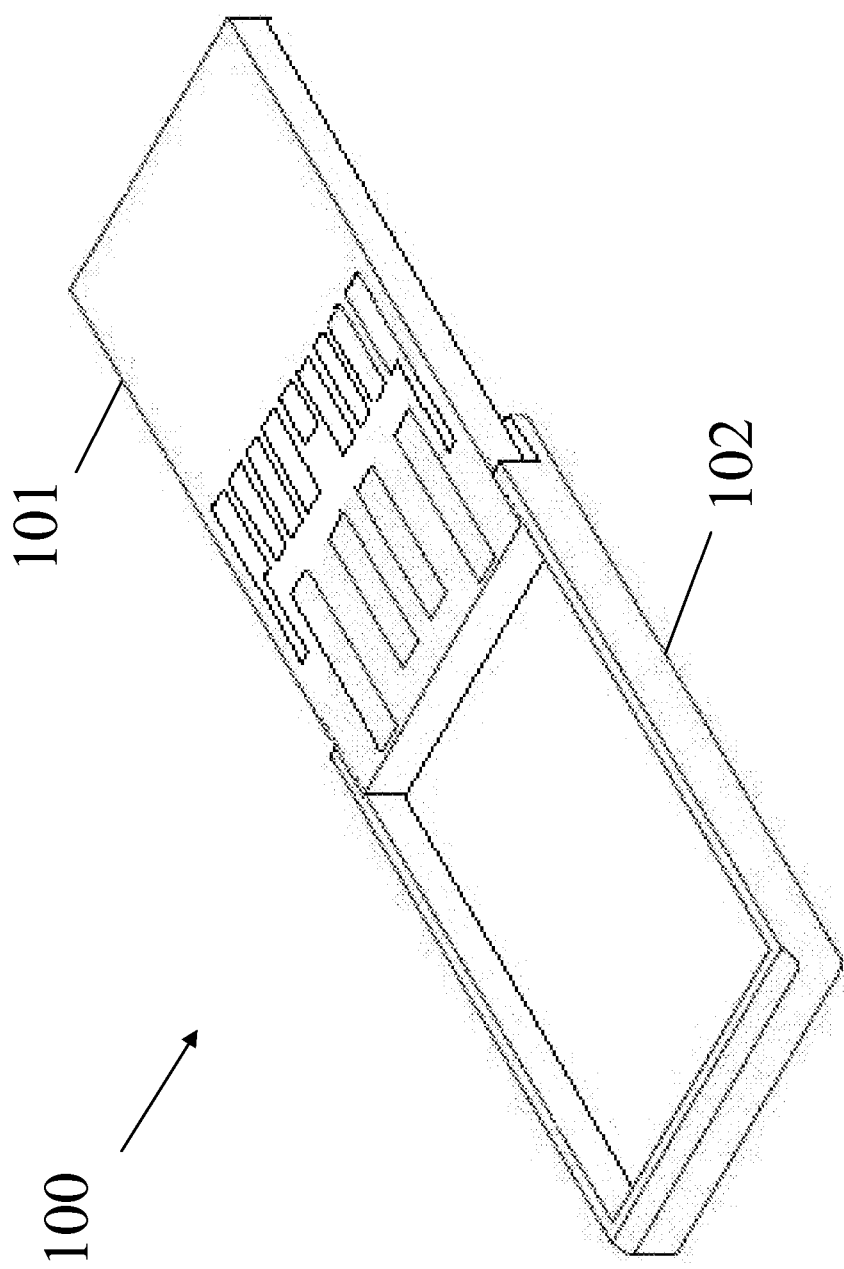
FIG. 9 is a diagram of an electrical interface device in accordance with another embodiment of the present invention.

FIG. 9 is a diagram of an electrical interface device 100 in accordance with another embodiment of the present invention. Referring to FIG. 9, electrical interface device 100 includes an electronic card 101 and a carrier 102. Electronic card 101 is slidably movable with respect to carrier 102. Depending on actual applications, the thickness of carrier 102 may vary from 1 mm to 2 mm.

Figure 10A:
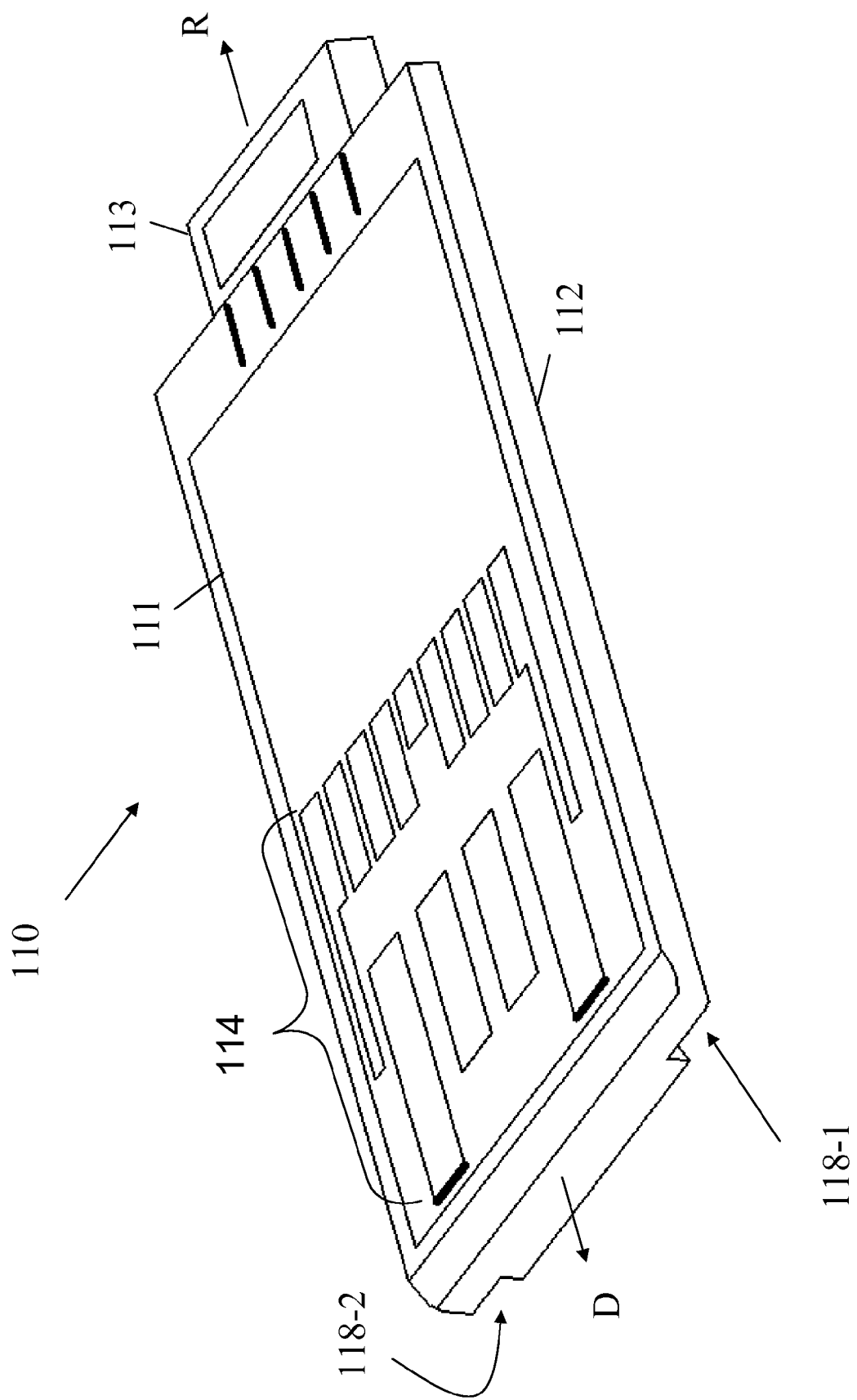
FIG. 10A is a diagram of an electrical interface device in accordance with still another embodiment of the present invention.

FIG. 10A is a diagram of an electrical interface device 110 in accordance with still another embodiment of the present invention. Referring to FIG. 10A, electrical interface device 110 includes an electronic card 111, a carrier 112 for supporting the electronic card 111, a first connector 114 and a second connector 113. First connector 114, including a first and a second row of contact pads, serves as a first interface for a USB Standard-A connection. Second connector 113, for example, a Mini USB connector, serves as a second interface for extended USB connection for electrical interface device 110. The Mini USB connector includes a smaller USB plug or receptacle, and is generally classified as Mini-A and Mini-B, which are specified by the On-The-Go Supplement to the USB 2.0 Specification (USB OTG).

Carrier 112 includes a first guide trench 118-1 extending substantially in parallel with an insertion direction, shown as "D" of first connector 114 or an insertion direction "R" of the second connector 113. As has been previously discussed with respect to FIG. 7B, first guide trench 118-1 facilitates the compactness of the holder or receptacle. Carrier 112 may further include a second guide trench 118-2 extending substantially in parallel with the insertion direction D or R, to further facilitate the compactness of the holder or receptacle.

Figure 10B:
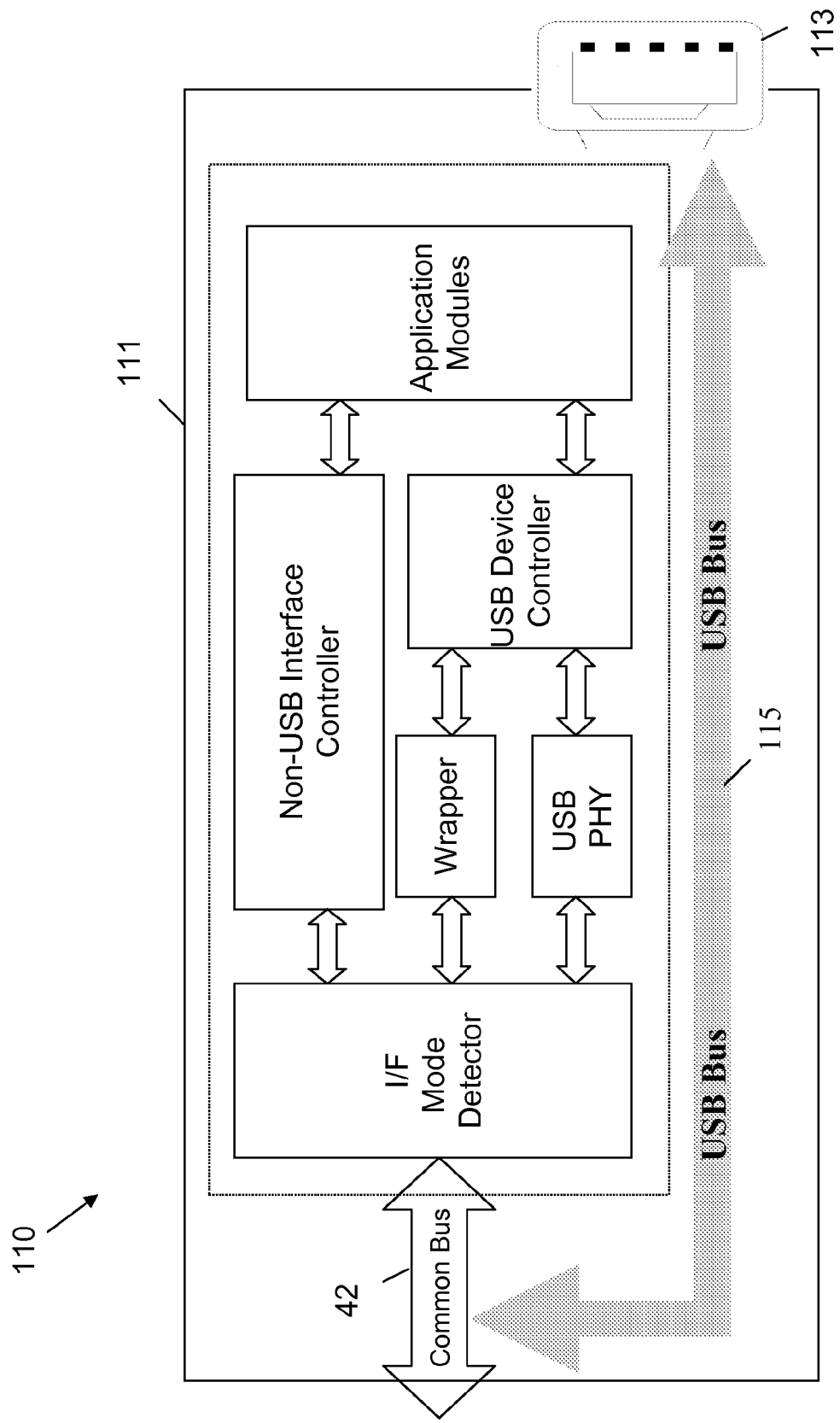
FIGS. 10B and 10C are functional block diagrams of the electrical interface device illustrated in FIG. 10A.
Figure 10C:
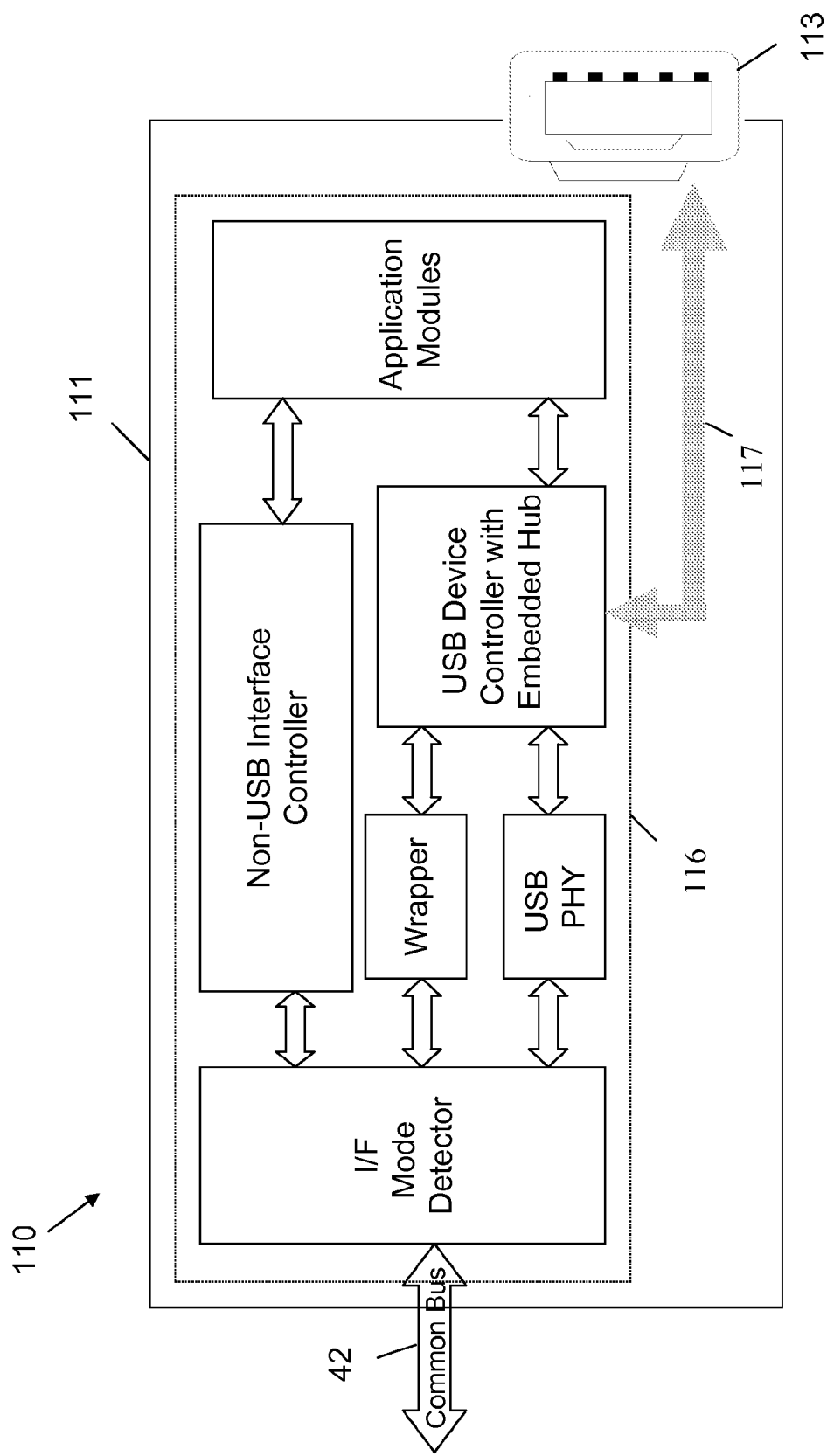

FIGS. 10B and 10C are functional block diagrams of the electrical interface device 110 illustrated in FIG. 10A. Referring to FIG. 10B, USB extended connector 113 bypasses USB-compatible signals to common bus 42 over a USB bus 115. Alternatively, referring to FIG. 1C, electrical interface device 110 includes a USB device controller 116 further comprising an embedded USB hub for receiving USB-compatible signals from second connector 113 over a USB bus 117.

Figure 11:
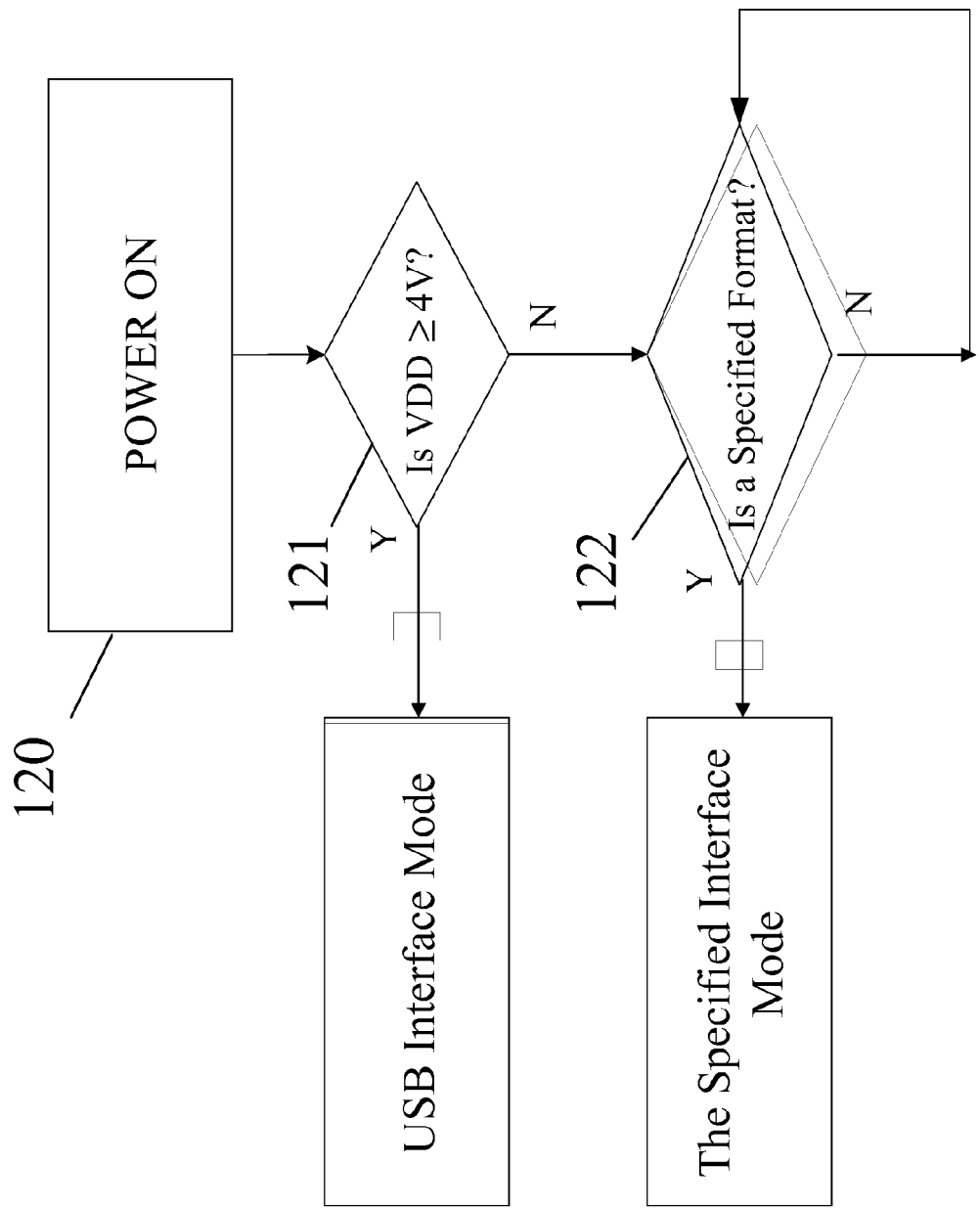
FIG. 11 is a flow diagram illustrating a method for interface mode detection at a device side.

FIG. 11 is a flow diagram illustrating a method for interface mode detection on the device side. Referring to FIG. 11, a host to which an electrical interface device according to the present invention is connected is turned on at step 120. The power source voltage VDD at the host side is detected at step 121 to determine whether the VDD is equal to or greater than a voltage level a USB application requires. Normally, for USB signaling, the voltage level ranges from approximately 4.5V (volts) to 5.5V, while a non-USB application or a Mu application is operated at a voltage level of approximately 1.8V or 3.3V. At step 121, if the VDD level at the host side is equal to or greater than 4V, it is determined that the mode of operation is a USB application, for example, the USB 2.0. If the VDD level at the host side is smaller than 4V, at step 122, it is determined that the mode of operation is either a Mu application or a non-USB application, depending on a specified format such as, for example, a flag sent from the host.

Figure 12:
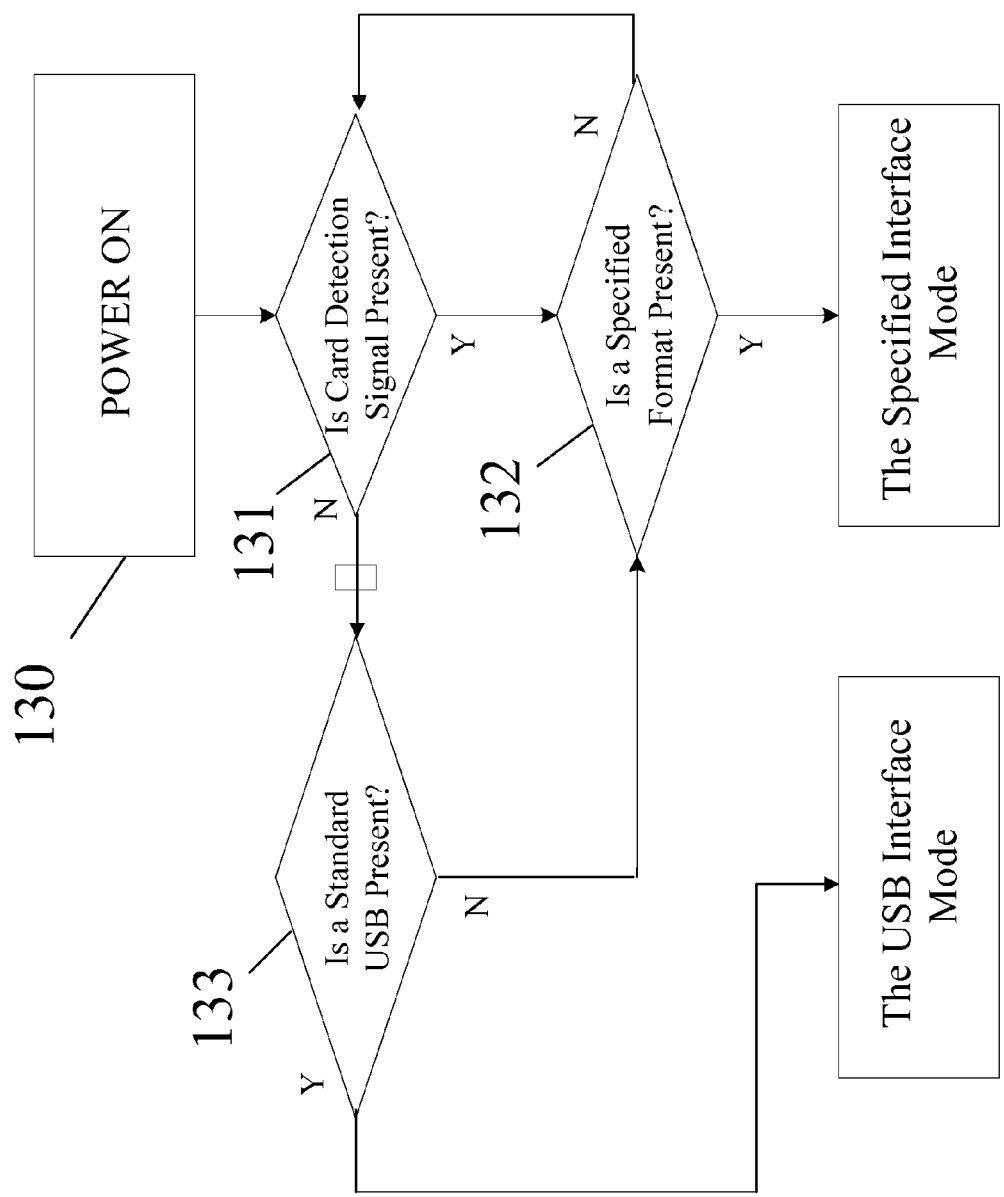
FIG. 12 is a flow diagram illustrating a method for interface mode detection at a host side.

FIG. 12 is a flow diagram illustrating a method for interface mode detection at a host side. Referring to FIG. 12, the host is turned on at step 130. Next, at step 131, it is determined whether a Card-Detect signal is detected. The Card-Detect signal is present at pin 13 illustrated in FIG. 4B or pin 10 in FIG. 6B. In response to the Card-Detection signal, which means that an electrical interface device according to the present invention is in use, at step 132, it is determined that the mode of operation is either a Mu application or a non-USB application, depending on a specified format. The electrical interface device operates at the Mu mode if the specified format includes a Mu format and is responded by the electrical interface device. The electrical interface device operates in the non-USB mode if the specified format includes a format different from the Mu format and is responded by the electrical interface device. If the Card-Detect signal is not present, at step 133, it is determined whether the electrical interface device supports standard USB. If confirmative, the host determines that the electrical interface device operates in USB mode. Otherwise, it is determined that the mode of operation is either a Mu application or a non-USB application, depending on a specified format.

Figure 13A:
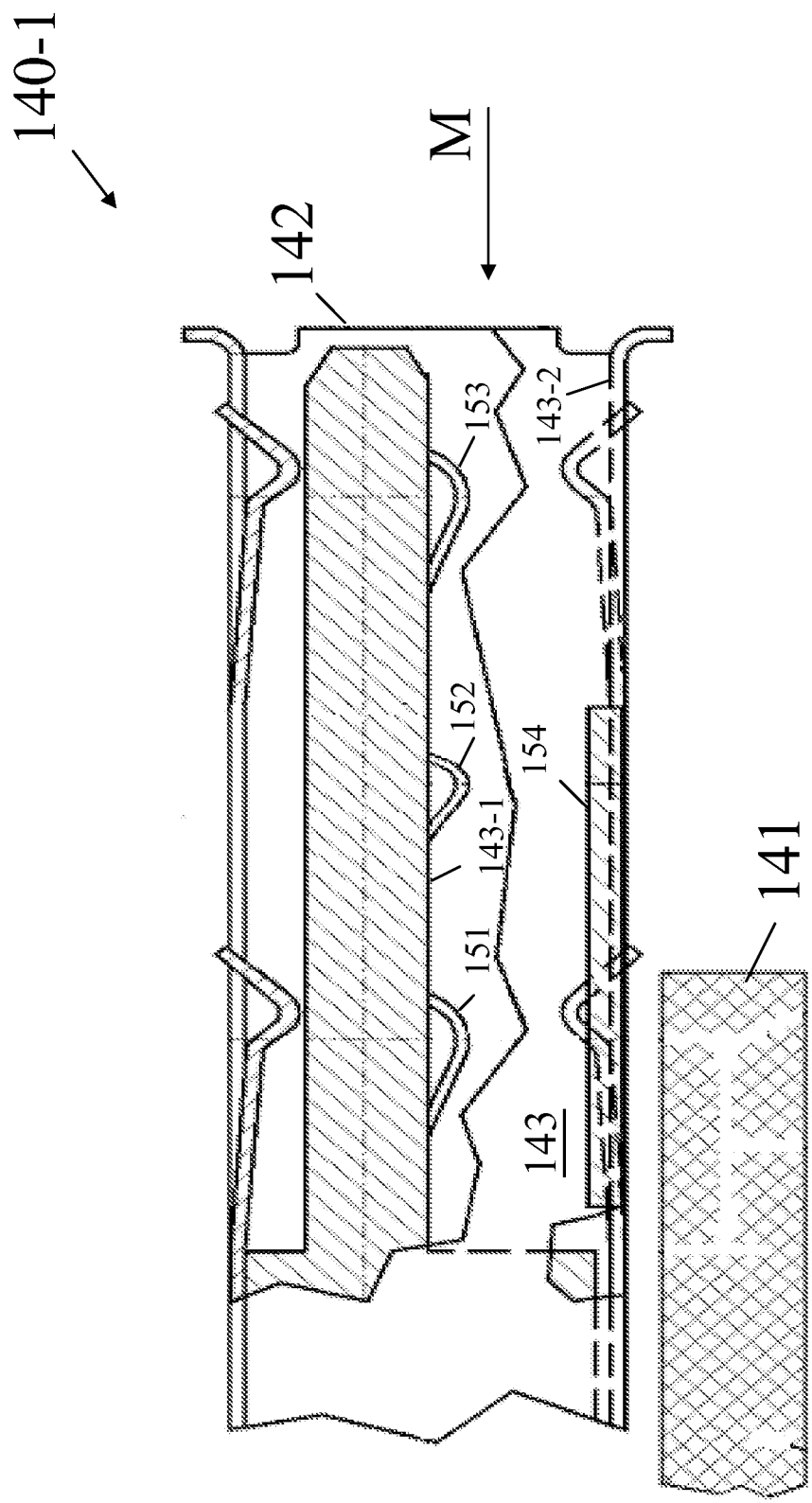
FIG. 13A is cross-sectional diagram of a receptacle 140-1 in accordance with an example of the present invention.

FIG. 13A is cross-sectional diagram of a receptacle 140-1 in accordance with an example of the present invention. Referring to FIG. 13A, the receptacle 140-1, which may be electrically coupled with a printed circuit board (PCB) 141 related to a host device, may include a housing 142, a first, second and third rows of contacts 151, 152 and 153, and at least one protrusion 154. The first, second and third rows of contacts 151, 152 and 153 and the at least one protrusion 154 may be disposed within a chamber 143 defined by inner surfaces of the housing 142. Specifically, the first, second and third rows of contacts 151, 152 and 153 may be arranged at a first inner surface 143-1 of the housing 142, and the at least one protrusion 154 may be arranged on a second inner surface 143-2 of the housing 142. The first inner surface 143-1 and the second inner surface 143-2 may be opposed to one another. Furthermore, the first row of contacts 151 may be configured to electrically couple to a first row of contact pads of an electrical interface device according to the present invention such as, for example, the electrical interface device 95 described and illustrated with reference to FIG. 7B when the electronic interface device is inserted into the chamber 143 along a direction M indicated. Similarly, the second row of contacts 152 may be configured to electrically couple to a second row of contact pads of the electrical interface device. The third row of contacts 153, however, may be configured to electrically couple to a row of contact pads of a USB-compatible plug (not shown) when the USB-compatible plug is inserted into the chamber 143 along the direction M.

The at least one protrusion 154 may be arranged to prevent incorrect insertion of an electrical interface device such as the electrical interface device 95. In one example, the at least one protrusion 154 may include a protrusion having a shape for mating with a guide trench such as the guide trench 98-1 or 98-2 described and illustrated with reference to FIG. 7B. In another example, the at least one protrusion 154 may include a pair of protrusions having shapes for respectively mating with a pair of guide trenches such as the guide trenches 198-1 and 198-2. Referring also to FIG. 7B, the electrical interface device 95 provided with the guide trenches 98-1 and 98-2 may pass the at least one protrusion 154 when inserted correctly. The at least one protrusion 154 therefore may prevent the electrical interface device 95 from being inserted upside down. Furthermore, the at least one protrusion 154 may be arranged to reject an unauthorized insertion of a removable device other than the electrical interface device according to the present invention. For example, conventional MMC or SD cards, which generally may not include any guide trenches corresponding to the at least one protrusion 154, may be blocked when inserted. Moreover, the at least one protrusion 154 may be arranged to allow a USB-compatible plug when inserted to contact only the third row of contacts 153 and prevent the USB-compatible plug from contacting the first row of contacts 151 and the second row of contacts 152.

The receptacle 140-1 in the present example may support a USB-compatible mode and 1-bit, 4-bit and 8-bit Mu modes operations of an electrical interface device according to the present invention. In another example, the second row of contacts 152 may be eliminated. The receptacle 140-1 absent from the second row of contacts 152 may support the USB mode and 1-bit Mu mode operations of the electrical interface device, referring also to FIG. 6C. The dimensions and related parameters of the receptacle 140-1 may be similar to those of a USB receptacle specified in Universal Serial Bus Specification, Revision 2.0, Apr. 27, 2000.

Figure 13B:
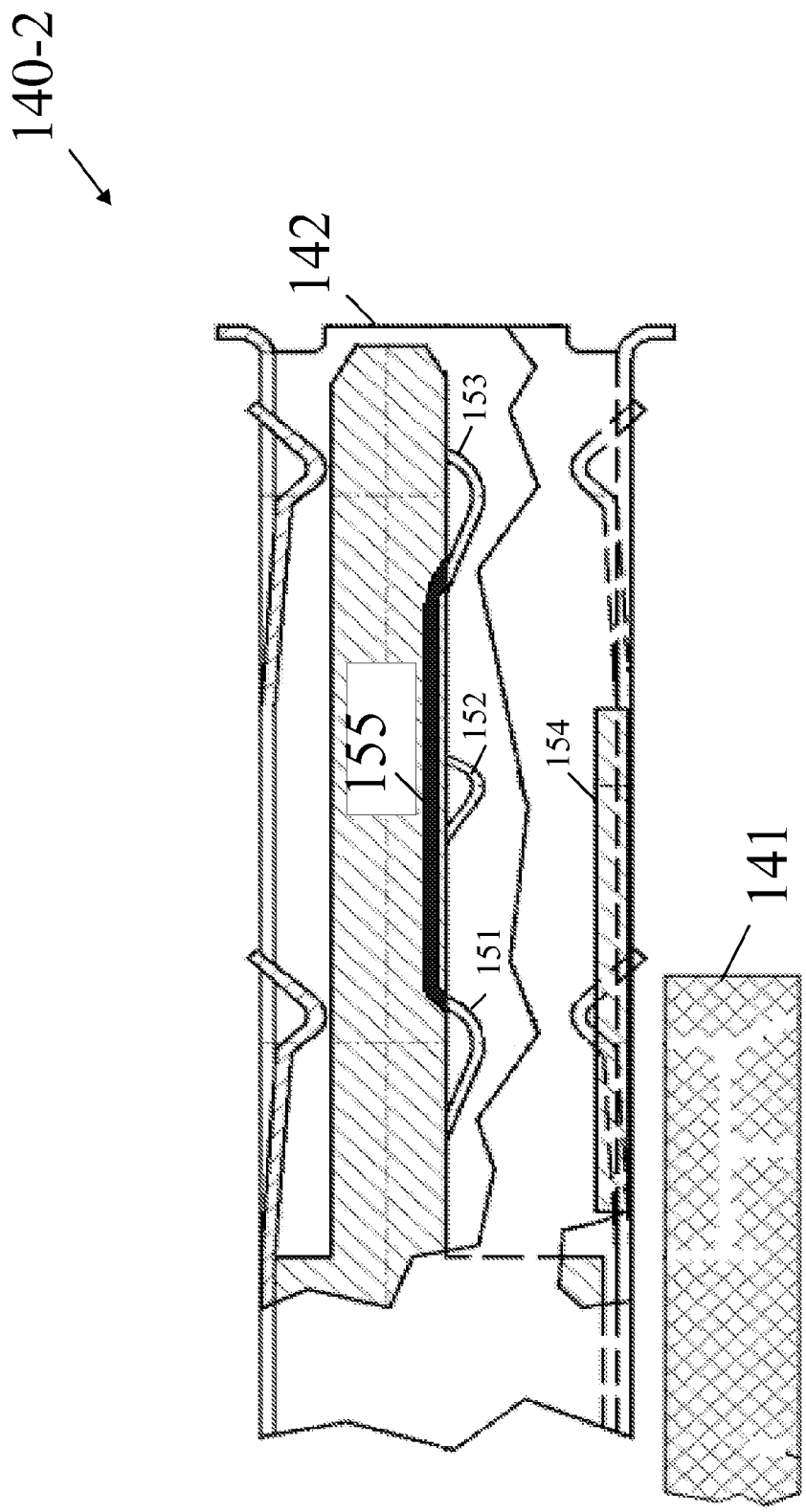
FIG. 13B is a cross-sectional diagram of a receptacle 140-2 in accordance with another example of the present invention.

FIG. 13B is a cross-sectional diagram of a receptacle 140-2 in accordance with another example of the present invention. Referring to FIG. 13B, the receptacle 140-2 may be similar to the receptacle 140-1 described and illustrated with reference to FIG. 13A except that, for example, the first row of contacts 151 and the third row of contacts 153 may be electrically coupled to one another through conductive wires 155.

Figure 13C:
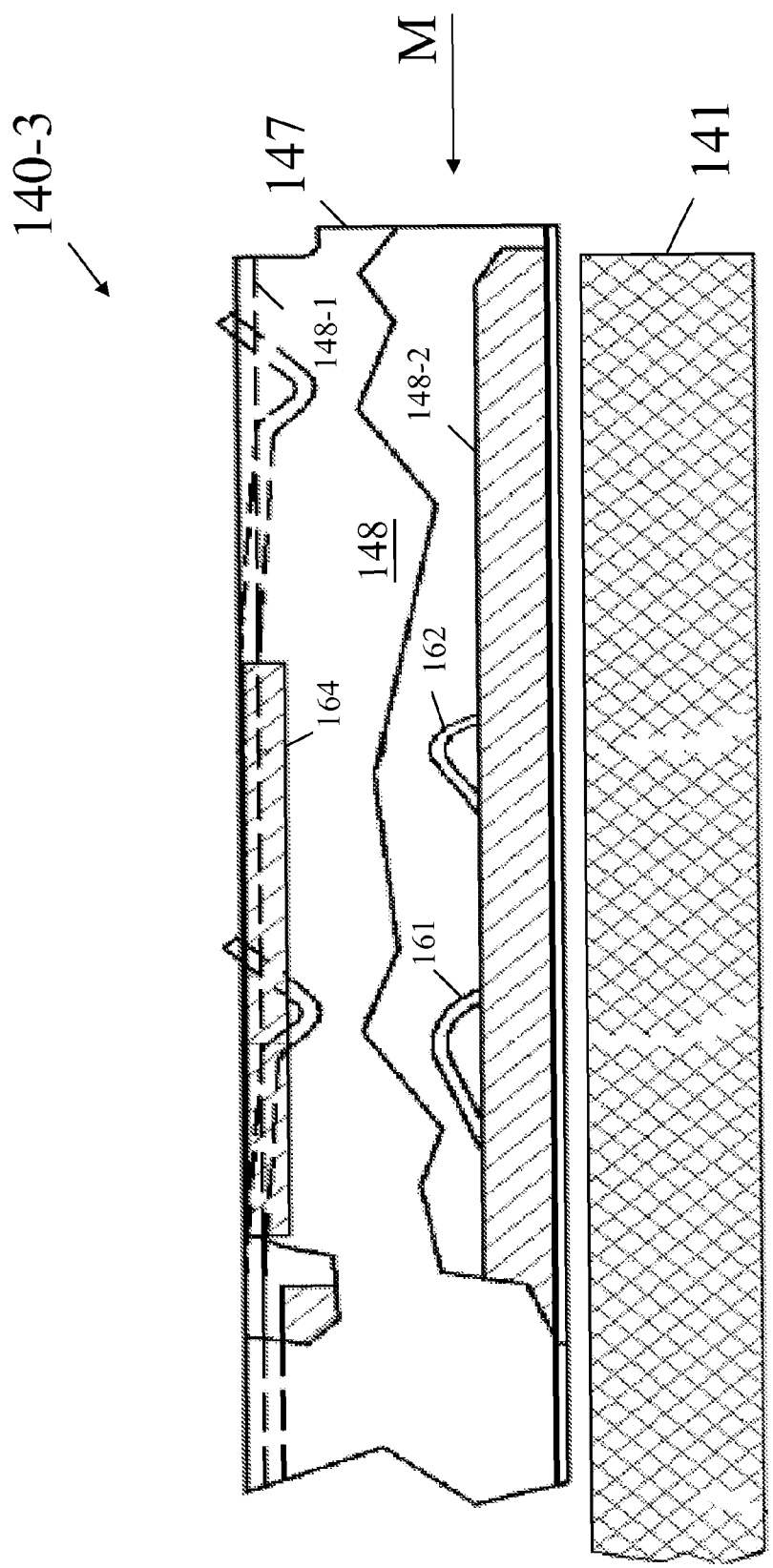
FIG. 13C is cross-sectional diagram of a receptacle 140-3 in accordance with still another example of the present invention.

FIG. 13C is cross-sectional diagram of a receptacle 140-3 in accordance with still another example of the present invention. Referring to FIG. 13C, the receptacle 140-3, which may be electrically coupled with the PCB 141, may include a first row of contacts 161 and at least one protrusion 164. A chamber 148 may be defined by inner surfaces, including at least a first inner surface 148-1 and a second inner surface 148-2, of a housing 147. The first row of contacts 161 and the at least one protrusion 154 may be arranged at the second inner surface 148-2 and the first inner surface 148-1, respectively. The first row of contacts 161 may be configured to electrically couple a first row of contact pads of an electrical interface device according to the present invention when the electronic interface device is inserted into the chamber 148 along the direction M. The at least one protrusion 164 may be configured to prevent incorrect insertion of an electrical interface device provided with at least one guide trench. Furthermore, the receptacle 140-3 may further include a second row of contacts 162, which may be configured to electrically couple a second row of contact pads of the electrical interface device.

Figure 13D:
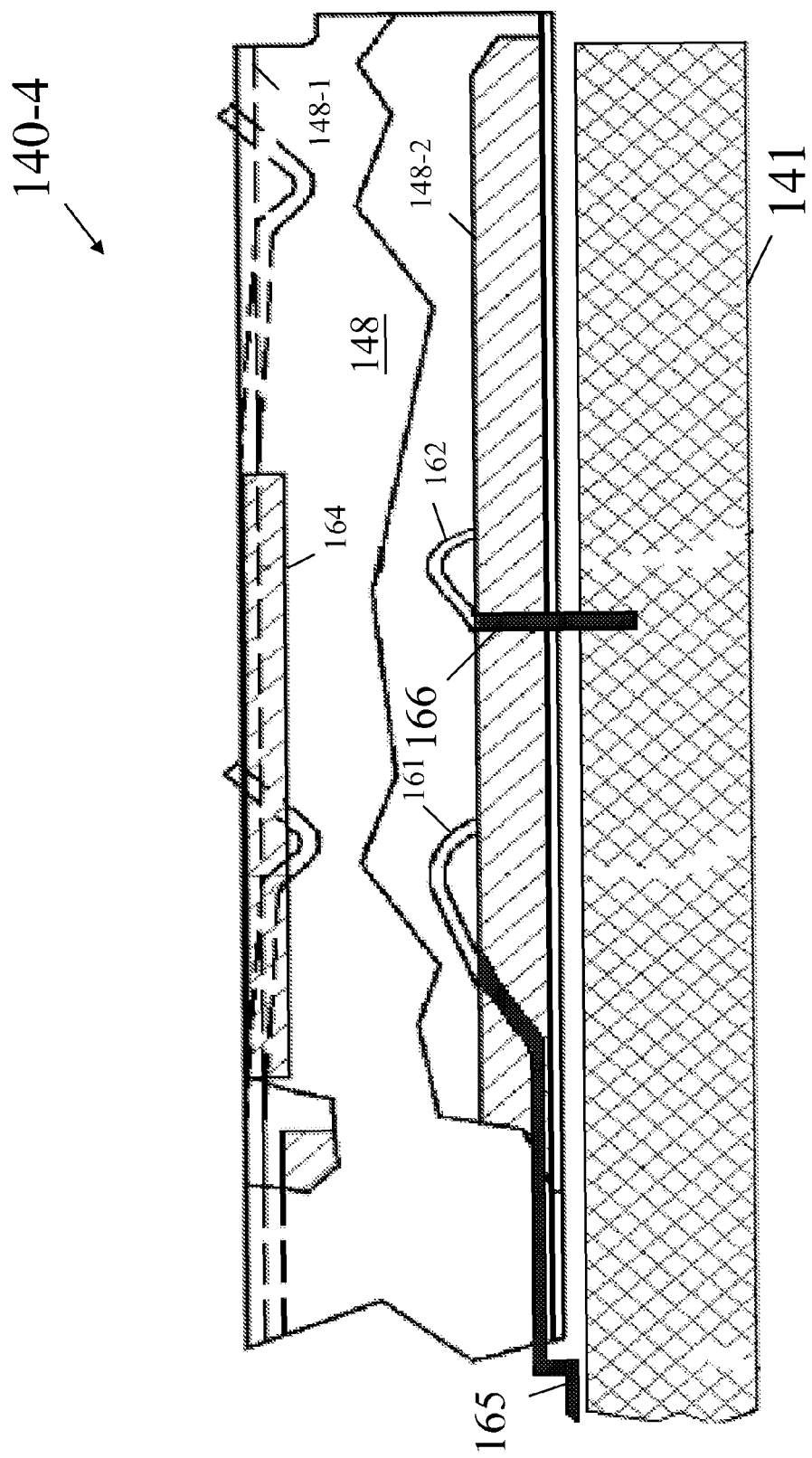
FIG. 13D is a cross-sectional diagram of a receptacle 140-4 in accordance with yet another example of the present invention.

FIG. 13D is a cross-sectional diagram of a receptacle 140-4 in accordance with yet another example of the present invention. Referring to FIG. 13D, the receptacle 140-4 may be similar to the receptacle 140-3 described and illustrated with reference to FIG. 13C except that, for example, the first row of contacts 161 and the second row of contacts 162 may be electrically coupled to the PCB 141 through conductive wires 165 and 166, respectively.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A receptacle device for receiving an electrical interface device, the electrical interface device being capable of transferring data to and from a host and being adapted to operate in a universal serial bus (USB)-compatible mode, a Mu mode or a non-USB-compatible mode, the receptacle comprising:
a housing including a first inner surface and a second inner surface, the first inner surface being opposed to the second inner surface;
a chamber defined by the first inner surface and the second inner surface of the housing;
a first row of contacts arranged at the first inner surface, the first row of contacts being capable of electrically coupling to a first row of pads of the electrical interface device, the first row of pads of the electrical interface device being configured to support at least the USB-compatible mode operation and a 1-bit Mu mode operation; and
a second row of contacts arranged at the first inner surface, the second row of contacts being capable of electrically coupling to a row of pads of a USB-compatible plug, the row of pads of the USB-compatible plug being configured to support the USB-compatible mode operation.

2. The receptacle device of claim 1 further comprising at least one protrusion on the second inner surface, the at least one protrusion being arranged to prevent the first row of contacts from an unauthorized contact.

3. The receptacle device of claim 2, wherein the at least one protrusion has a shape for mating with a guide trench of the electrical interface device.

4. The receptacle device of claim 2, wherein the at least one protrusion includes a pair of protrusions having shapes for respectively mating with a pair of guide trenches of the electrical interface device.

5. The receptacle device of claim 1, wherein the first row of contacts is substantially parallel with the second row of contacts.

6. The receptacle device of claim 1 further comprising a third row of contacts at the first inner surface between the first row of contacts and the second row of contacts.

7. The receptacle device of claim 6, wherein the third row of contacts is configured to electrically coupled to a second row of pads of the electrical interface device when the electrical interface device is inserted into the chamber, the second row of pads of the electrical interface device being configured to support at least one of a 4-bit Mu mode operation, an 8-bit Mu mode operation or the non-USB-compatible mode operation.

8. The receptacle device of claim 1, wherein the first row of contacts is electrically coupled to the second row of contacts.

9. The receptacle device of claim 1, wherein the housing is disposed at or near a printed circuit board related to the host.

10. The receptacle device of claim 1, wherein the electrical interface device includes a converter being configured to convert between a non-USB interface and a USB interface.

11. The receptacle device of claim 1, wherein the electrical interface device includes a converter being configured to electrically connect between a removable device and the receptacle device.

12. A receptacle device for an electrical interface device, the electrical interface device being capable of transferring data to and from a host and being adapted to operate in a universal serial bus (USB)-compatible mode, a Mu mode or a non-USB-compatible mode, the receptacle comprising:
a chamber defined by a first inner surface and a second inner surface, the first inner surface being opposed to the second inner surface;
a first row of contacts arranged at the first inner surface, the first row of contacts being configured to electrically couple to a first row of pads of the electrical interface device when the electrical interface device is inserted into the chamber in a direction, wherein the first row of pads of the electrical interface device is configured to support at least the USB-compatible mode operation and a 1-bit Mu mode operation; and
a second row of contacts arranged at the first inner surface, the second row of contacts being configured to electrically couple to a row of pads of a USB-compatible plug when the USB-compatible plug is inserted into the chamber in the direction.

13. The receptacle device of claim 12 further comprising at least one protrusion on the second inner surface, the at least one protrusion being arranged to prevent the first row of contacts from being contacted by a USB-compatible plug or a non-USB removable device.

14. The receptacle device of claim 12 further comprising a third row of contacts at the first inner surface between the first row of contacts and the second row of contacts.

15. The receptacle device of claim 14, wherein the third row of contacts is configured to electrically coupled to a second row of pads of the electrical interface device, the second row of pads of the electrical interface device being configured to support at least one of a 4-bit Mu mode operation, an 8-bit Mu mode operation or the non-USB-compatible mode operation.

16. The receptacle device of claim 12, wherein the first row of contacts is electrically coupled to the second row of contacts.

17. The receptacle device of claim 12, wherein the row of pads of the USB-compatible plug is configured to support the USB-compatible mode operation.

18. A receptacle device for an electrical interface device, the electrical interface device being capable of transferring data to and from a host and being adapted to operate in a universal serial bus (USB)-compatible mode, a Mu mode or a non-USB-compatible mode, the receptacle comprising:
a chamber defined by a first inner surface and a second inner surface, the first inner surface being opposed to the second inner surface; and
a first row of contacts arranged at the first inner surface, the first row of contacts being configured to electrically couple to a first row of pads of the electrical interface device when the electrical interface device is inserted into the chamber in a direction, and to support at least the USB-compatible mode operation and a 1-bit Mu mode operation.

19. The receptacle device of claim 18 further comprising at least one protrusion on the second inner surface, the at least one protrusion being arranged to prevent the first row of contacts from being contacted by a non-USB removable device.

20. The receptacle device of claim 18 further comprising a second row of contacts arranged at the first inner surface, the second row of contacts being configured to electrically couple to a row of pads of a USB-compatible plug when the USB-compatible plug is inserted into the chamber in the direction.

21. The receptacle device of claim 20 further comprising a third row of contacts at the first inner surface between the first row of contacts and the second row of contacts.

22. The receptacle device of claim 21, wherein the third row of contacts is configured to electrically coupled to a second row of pads of the electrical interface device, the second row of pads of the electrical interface device being configured to support at least one of a 4-bit Mu mode operation, an 8-bit Mu mode operation or the non-USB-compatible mode operation.

23. The receptacle device of claim 21, wherein the first row of contacts is electrically coupled to the second row of contacts.

24. The receptacle device of claim 18 further comprising a second row of contacts at the first inner surface, the second row of contacts being configured to electrically coupled to a second row of pads of the electrical interface device when the electrical interface device is inserted into the chamber.

25. The receptacle device of claim 18, wherein the at least one protrusion includes a protrusion having a shape for mating with a guide trench of the electrical interface device.

26. The receptacle device of claim 18, wherein the at least one protrusion includes a pair of protrusions having shapes for respectively mating with a pair of guide trenches of the electrical interface device.

27. The receptacle device of claim 18, wherein the first row of pads of the electrical interface device is configured to support one of the USB-compatible mode operation and a 1-bit Mu mode operation.

28. The receptacle device of claim 18, wherein the electrical interface device includes a converter being configured to convert between the non-USB-compatible mode operation and the USB-compatible mode operation.

29. The receptacle device of claim 18, wherein the electrical interface device includes a converter being configured to convert between the non-USB-compatible mode operation and the Mu-mode operation.

30. The receptacle device of claim 18, wherein the electrical interface device includes a converter being configured to convert between the USB-compatible mode operation and the Mu-mode operation.

* * * * *

UNITED STATES PATENT AND TRADEMARK OFFICE
CERTIFICATE OF CORRECTION

| | | |
|---|---|---|
| PATENT NO. | : 8,070,067 B2 | Page 1 of 1 |
| APPLICATION NO. | : 11/849224 | |
| DATED | : December 6, 2011 | |
| INVENTOR(S) | : Liu | |

It is certified that error appears in the above-identified patent and that said Letters Patent is hereby corrected as shown below:

Column 10,
Line 52, "FIG. 1C" should read --FIG. 10C--.

Signed and Sealed this
Tenth Day of July, 2012

David J. Kappos
*Director of the United States Patent and Trademark Office*